(12) United States Patent
Wang et al.

(10) Patent No.: US 12,429,968 B2
(45) Date of Patent: Sep. 30, 2025

(54) DISPLAY SUBSTRATE AND DISPLAY DEVICE

(71) Applicants: Chengdu BOE Optoelectronics Technology Co., Ltd., Sichuan Province (CN); BOE Technology Group Co., Ltd., Beijing (CN)

(72) Inventors: Wei Wang, Beijing (CN); Yi Zhang, Beijing (CN); Shun Zhang, Beijing (CN); Yuanqi Zhang, Beijing (CN); Chang Luo, Beijing (CN); Ping Wen, Beijing (CN); Yu Wang, Beijing (CN); Yang Zeng, Beijing (CN); Tianci Chen, Beijing (CN)

(73) Assignees: Chengdu BOE Optoelectronics Technology Co., Ltd., Sichuan Province (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/580,530

(22) PCT Filed: Aug. 22, 2022

(86) PCT No.: PCT/CN2022/114047
§ 371 (c)(1),
(2) Date: Jan. 18, 2024

(87) PCT Pub. No.: WO2023/040596
PCT Pub. Date: Mar. 23, 2023

(65) Prior Publication Data
US 2024/0319808 A1  Sep. 26, 2024

(30) Foreign Application Priority Data
Sep. 14, 2021 (CN) .......................... 202111074888.X

(51) Int. Cl.
*G06F 3/041* (2006.01)
*G06F 3/044* (2006.01)
*H10K 59/40* (2023.01)

(52) U.S. Cl.
CPC .......... *G06F 3/0412* (2013.01); *G06F 3/0446* (2019.05); *H10K 59/40* (2023.02); *G06F 2203/04107* (2013.01)

(58) Field of Classification Search
CPC ...... G06F 3/0412; G06F 3/041; G06F 3/0446; G06F 2203/04107; G06F 3/04164;
(Continued)

(56) References Cited
U.S. PATENT DOCUMENTS 11,144,168 B1 * 10/2021 Lin ........................ G06F 3/0448
2013/0106747 A1 * 5/2013 Choi ...................... G06F 3/0446
                                                                    345/173

(Continued)

FOREIGN PATENT DOCUMENTS

CN  103294247 A   9/2013
CN  204731755 U  10/2015
(Continued)

OTHER PUBLICATIONS

International Search Report, mailed Nov. 1, 2022, from PCT International Application No. PCT/CN2022/114047, 6 pages.

*Primary Examiner* — Md Saiful A Siddiqui
(74) *Attorney, Agent, or Firm* — Workman Nydegger

(57) ABSTRACT

A display substrate and a display device are disclosed. The display substrate includes: a base substrate including a display area and a frame area surrounding the display area; a group of first touch lines located in the frame area on one side of the display area; an insulation layer on a side of a layer where the group of first touch lines is located away from the base substrate; and a shielding structure on a side (Continued)

of the insulating layer away from the layer where the group of first touch lines is located, the shielding structure being located in the frame area on one side of the display area. In a same frame area, an orthographic projection of the shielding structure on the base substrate overlaps with an orthographic projection of part of the plurality of first touch lines on the base substrate.

19 Claims, 18 Drawing Sheets

(58) Field of Classification Search
CPC .. G06F 3/0443; H10K 59/126; H10K 59/131; H10K 59/40
See application file for complete search history.

(56) References Cited

U.S. PATENT DOCUMENTS

| | | | |
|---|---|---|---|
| 2013/0141380 A1* | 6/2013 | Wang | G06F 3/0443 345/173 |
| 2013/0229362 A1 | 9/2013 | Liu et al. | |
| 2014/0232956 A1* | 8/2014 | Kwon | G02F 1/133305 349/12 |
| 2019/0012026 A1* | 1/2019 | Li | G06F 3/0446 |
| 2019/0095007 A1* | 3/2019 | Jeong | H10K 59/873 |
| 2019/0129567 A1* | 5/2019 | Rhe | G06F 3/0443 |
| 2019/0204942 A1 | 7/2019 | Xu et al. | |
| 2020/0401274 A1* | 12/2020 | Moon | G06F 3/0445 |
| 2021/0083013 A1 | 3/2021 | Bang et al. | |
| 2021/0192987 A1 | 6/2021 | Du et al. | |
| 2022/0107706 A1* | 4/2022 | Lu | H10D 86/441 |
| 2023/0024214 A1* | 1/2023 | Tong | H10K 59/122 |
| 2024/0032350 A1 | 1/2024 | Ye | |

FOREIGN PATENT DOCUMENTS

| | | |
|---|---|---|
| CN | 107479283 A | 12/2017 |
| CN | 108062182 A | 5/2018 |
| CN | 110992834 A | 4/2020 |
| CN | 106803514 B | 6/2020 |
| CN | 112510064 A | 3/2021 |
| CN | 113629039 A | 11/2021 |
| CN | 216286614 U | 4/2022 |

* cited by examiner

DISPLAY SUBSTRATE AND DISPLAY DEVICE

CROSS-REFERENCE TO RELATED APPLICATIONS

The disclosure is a National Stage of International Application No. PCT/CN2022/114047, filed on Aug. 22, 2022, which claims priority to Chinese patent application No. 202111074888.X, filed with the China National Intellectual Property Administration on Sep. 14, 2021 and entitled "Display Substrate and Display Device", the content of which is hereby incorporated by reference in its entirety.

TECHNICAL FIELD

The disclosure relates to the field of display technology, and in particular to a display substrate and a display device.

BACKGROUND

An organic electroluminescent (OLED) display device is a display screen based on organic electroluminescent diodes. The OLED has excellent characteristics such as self-illumination, high contrast, thin thickness, wide viewing angle, fast response speed, being able to be used for flexible panels, wide operating temperature range, simple structure and manufacturing process, etc., and has attracted more and more attention and has a broad application prospect. In the related technology, the touch function is integrated by embedding a touch module in the OLED display module, to realize integration of the display function and the touch function of the OLED display device.

SUMMARY

Embodiments of the present disclosure provide a display substrate and a display device, and the specific solution is as follows.

In an aspect, an embodiment of the present disclosure provides a display substrate, including:
- a base substrate; where the base substrate includes a display area, and a frame area surrounding the display area;
- a plurality of first touch lines in the frame area located on at least one side of the display area;
- an insulation layer on a side, away from the base substrate, of a layer where the plurality of first touch lines are located; and
- a shielding structure on a side, away from the layer where the plurality of first touch lines are located, of the insulation layer; where the shielding structure is in the frame area located on at least one side of the display area; and in a same frame area, an orthographic projection of the shielding structure on the base substrate overlaps with an orthographic projection of at least part of the plurality of first touch lines on the base substrate.

In some embodiments, in the above display substrate according to embodiments of the present disclosure, the frame area includes a first frame area for binding to a flexible circuit board; the shielding structure includes a first shielding structure in the first frame area; and the plurality of first touch lines comprise a plurality of touch leads in the first frame area.

In some embodiments, the above-mentioned display substrate according to embodiments of the present disclosure further includes a bridging layer and a touch layer which are stacked on the base substrate and insulated from each other; where the first shielding structure is located in the touch layer, and the plurality of touch leads are located in the bridging layer.

In some embodiments, the above-mentioned display substrate according to embodiments of the present disclosure further includes a first gate metal layer, a second gate metal layer, a first source-drain metal layer, a second source-drain metal layer, a bridging layer and a touch layer which are stacked on the base substrate and insulated from each other; where the first shielding structure is located in at least one of the first source-drain metal layer, the second source-drain metal layer, the bridging layer, or the touch layer; and the plurality of touch leads are located in the first gate metal layer and/or the second gate metal layer.

In some embodiments, in the above display substrate according to embodiments of the present disclosure, the first frame area includes a first fan-out area, a bending area and a second fan-out area arranged in sequence in a direction away from the display area; and the first shielding structure and the plurality of touch leads are located in the second fan-out area.

In some embodiments, in the above display substrate according to embodiments of the present disclosure, the frame area further includes a second frame area opposite to the first frame area, a third frame area connecting the first frame area and the second frame area, and a fourth frame area opposite to the third frame area; and in the first fan-out area, the second frame area, the third frame area and the fourth frame area, the plurality of first touch lines further comprise a plurality of first touch signal lines in the bridging layer, the touch layer further includes a plurality of second touch signal lines, and at least part of the plurality of second touch signal lines are electrically connected to the plurality of first touch signal lines in one-to-one correspondence.

In some embodiments, in the above display substrate according to embodiments of the present disclosure, the frame area includes a first frame area for binding to a flexible circuit board, a second frame area opposite to the first frame area, a third frame area connecting the first frame area and the second frame area, and a fourth frame area opposite to the third frame area; where the first frame area includes a first fan-out area, a bending area and a second fan-out area arranged in sequence in a direction away from the display area; and in the first fan-out area, the second frame area, the third frame area and the fourth frame area, the shielding structure includes a second shielding structure, and the plurality of first touch lines comprise a plurality of first touch signal lines.

In some embodiments, the above-mentioned display substrate according to embodiments of the present disclosure further includes a bridging layer and a touch layer which are stacked on the base substrate and insulated from each other; where the second shielding structure is located in the touch layer, and the plurality of first touch signal lines are located in the bridging layer.

In some embodiments, the above display substrate according to embodiments of the present disclosure further includes: a plurality of dummy lines in the first fan-out area; where, in the first fan-out area, the plurality of first touch signal lines are divided into at least one group of touch signal lines, and the plurality of dummy lines are on at least one side of both edges of the at least one group of touch signal lines.

In some embodiments, in the above display substrate according to embodiments of the present disclosure, the plurality of dummy lines comprise a plurality of first dummy lines in the touch layer, and a plurality of second dummy lines in the bridging layer; where, the plurality of first dummy lines have a greater number than the plurality of second dummy lines; and an orthographic projection of each of the plurality of second dummy lines on the base substrate substantially coincides with an orthographic projection of one of the plurality of first dummy lines on the base substrate.

In some embodiments, in the above display substrate according to embodiments of the present disclosure, the bridging layer further includes at least one ground wire on a side, away from the display area, of the first touch lines; and the shielding structure in the touch layer and/or the bridging layer is electrically connected to the ground wire.

In some embodiments, in the above display substrate according to embodiments of the present disclosure, the first source-drain metal layer and/or the second source-drain metal layer further includes a low-level signal line at least partially around the display area and in the frame area; and the first shielding structure in the first source-drain metal layer and/or the second source-drain metal layer is multiplexed with the low-level signal line.

In some embodiments, in the above display substrate according to embodiments of the present disclosure, the first source-drain metal layer and/or the second source-drain metal layer further includes a plurality of connection lines in the bending area; and the plurality of connection lines connect the touch leads and the first touch signal lines.

In some embodiments, in the above display substrate according to embodiments of the present disclosure, an orthographic projection of the shielding structure on the base substrate covers and is larger than orthographic projections of the plurality of first touch lines on the base substrate, and orthographic projections of gaps between the first touch lines on the base substrate.

In some embodiments, in the above display substrate according to embodiments of the present disclosure, the shielding structure includes a plurality of first shielding wires, and second shielding wires which are on a same layer as and intersect with the plurality of first shielding wires; where orthographic projections of the plurality of first shielding wires on the base substrate substantially coincide with orthographic projections of the plurality of first touch lines on the base substrate.

In some embodiments, the above-mentioned display substrate according to embodiments of the present disclosure further includes a plurality of second touch lines in the frame area; where the plurality of second touch lines and the shielding structure are on a same layer and have a same material, and at least two second touch lines are electrically connected to one same first touch line; where the shielding structure includes a plurality of sub-shielding structures, and the sub-shielding structure includes a plurality of first shielding wires and second shielding wires on a same layer as the plurality of first shielding wires and intersecting with the plurality of first shielding wires; where, in an extending direction of the first touch lines, the second touch lines and the first shielding wires are arranged alternately.

In some embodiments, in the above display substrate according to embodiments of the present disclosure, a line width of the second touch line and a line width of the first shielding wire are substantially same as a line width of the first touch line.

In another aspect, an embodiment of the present disclosure provides a display device, including the above-mentioned display substrate according to embodiments of the present disclosure.

In some embodiments, the above-mentioned display device according to embodiments of the present disclosure further includes a flexible circuit board electrically connected to the display substrate; where the flexible circuit board is on an opposite side of a display side of the display device.

In some embodiments, in the above display device according to embodiments of the present disclosure, the display substrate includes the display area, and a first frame area on a side of the display area for binding to the flexible circuit board; where, the first frame area includes a first fan-out area, a bending area and a second fan-out area arranged in sequence in a direction away from the display area; where the first fan-out area is on the display side, and the second fan-out area is on the opposite side.

DETAILED DESCRIPTION

Figure 1:
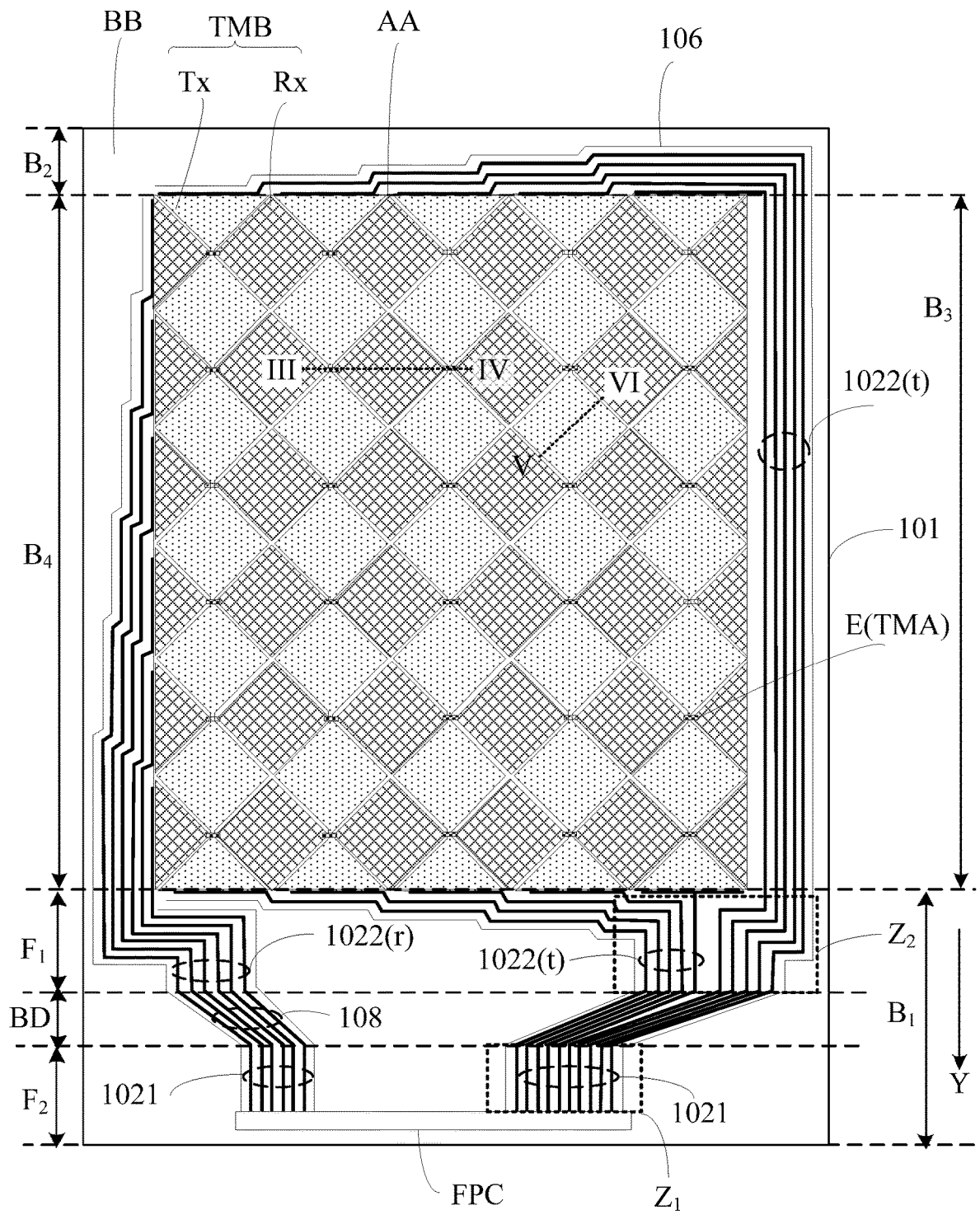
FIG. 1 is a schematic structural diagram of a display substrate according to an embodiment of the present disclosure.

In order to make the purpose, technical solutions and advantages of embodiments of the present disclosure more clear, the technical solutions of embodiments of the present disclosure will be clearly and completely described below in conjunction with the drawings of embodiments of the present disclosure. It should be noted that the size and shape of each figure in the drawings do not reflect the true scale, but are only intended to illustrate the present disclosure. The same or similar reference numerals represent the same or similar elements or elements having the same or similar functions throughout. Obviously, the described embodiments are some, but not all, of embodiments of the present disclosure. Based on the described embodiments of the present disclosure, all other embodiments obtained by those of ordinary skill in the art without creative efforts fall within the scope of protection of the present disclosure.

Unless otherwise defined, technical or scientific terms used here shall have their ordinary meaning understood by a person of ordinary skill in the art to which this disclosure belongs. "First", "Second" and similar words used in the description and claims in the disclosure do not indicate any order, quantity or importance, but are only used to distinguish different components. Words such as "include" or "comprise" mean that the elements or things appearing before the word include the elements or things listed after the word and their equivalents, without excluding other elements or things. "Inner", "outer", "up", "down", etc., are only used to express relative positional relationships. When the absolute position of the described object changes, the relative positional relationship may also change accordingly.

With the rapid development of the active-matrix organic light-emitting diode (AMOLED), the display has entered the era of the large screen, and people's love for the large screen will never be satisfied. In order to meet people's demand for the large screen, narrow frame, high resolution, lighter and thinner, the touch display equipped with the flexible multi-layer on cell (flexible metal layer on cell, FMLOC) technology is of great significance in the future development.

In the FMLOC technology, two layers of metal separated by an insulation layer are used to fabricate a touch function layer on a packaging layer of the OLED display module. One layer of metal is a bridging layer (TMA) including a plurality of first sub-touch lines, the other layer of metal is a touch layer (TMB) including a plurality of second sub-touch lines, and the first sub-touch lines are electrically connected with the second sub-touch line via through holes penetrating the insulation layer. In this way, the first sub-touch line and the second sub-touch line electrically connected to each other form a touch line with the low resistance, which can reduce the loss of the touch signal on the touch line, and is beneficial to improve the effect of touch recognition. However, in the present disclosure, it is found that after the whole machine is assembled, the touch signal and the antenna signal tend to interfere with each other, thus affecting the performance of the whole machine.

In order to improve the above-mentioned technical problems existing in the related technology, embodiments of the present disclosure provide a display substrate, as shown in FIG. 1 to FIG. 5, including:

a base substrate 101; where the base substrate 101 includes a display area AA, and a frame area BB surrounding the display area AA;

a plurality of first touch lines 102 in the frame area BB located on at least one side of the display area AA;

an insulation layer 103 on a side, away from the base substrate 101, of a layer where the plurality of first touch lines 102 are located; optionally, the insulation layer 103 may be an inorganic insulation layer or an organic insulation layer; and a shielding structure 104 on a side, away from the layer where the plurality of first touch lines 102 are located, of the insulation layer 103; where the shielding structure 104 is located in the frame area BB on at least one side of the display area AA; and in the same frame area BB, an orthographic projection of the shielding structure 104 on the base substrate 101 overlaps with an orthographic projection of at least part of the first touch lines 102 on the base substrate 101.

In the above display substrate according to embodiments of the present disclosure, by arranging the shielding structure 104 overlapping with the first touch lines 102, touch signals on the first touch lines 102 can be separated from external antenna signals through the shielding structure 104, effectively improving the problem of mutual interference between the touch signal and the antenna signal, and thus improving the performance of the whole machine and the user experience.

In some embodiments, in the above-mentioned display substrate according to embodiments of the present disclosure, as shown in FIG. 1 to FIG. 4, the frame area BB includes a first frame area $B_1$ for binding to a flexible circuit board FPC; the shielding structure 104 includes a first shielding structure 1041 located in the first frame area $B_1$; and the plurality of first touch lines 102 include a plurality of touch leads 1021 located in the first frame area $B_1$. In a second fan-out area $F_2$, an orthographic projection of the first shielding structure 1041 on the base substrate 101 overlaps with orthographic projections of the plurality of touch leads 1021 on the base substrate 101, so that the first shielding structure 1041 can be used for protecting the touch leads 1021, avoiding interference from antenna signals and the like on touch signals of the touch leads 1021. At the same time, the first shielding structure 1041 can also effectively shield the touch signals to prevent the touch signals from interfering with the antenna signals.

In some embodiments, in the above-mentioned display substrate according to embodiments of the present disclosure, as shown in FIG. 1 and FIG. 6 to FIG. 8, the frame area BB further includes a second frame area $B_2$ opposite to the first frame area $B_1$, and a third frame area $B_3$ and a fourth frame area $B_4$ that are opposite and respectively connected with the first frame area $B_1$ and the second frame area $B_2$. The first frame area $B_1$ includes a first fan-out area $F_1$, a bending area BD and a second fan-out area $F_2$ arranged in sequence in a direction Y away from the display area AA.

In the first fan-out area $F_1$, the second frame area $B_2$, the third frame area $B_3$ and the fourth frame area $B_4$, the shielding structure 104 includes a second shielding structure 1042, and the plurality of first touch lines 102 include a plurality of first touch signal lines 1022. An orthographic projection of the second shielding structure 1042 on the base substrate 101 overlaps with orthographic projections of the plurality of first touch signal lines 1022 on the base substrate 101.

Figure 9:
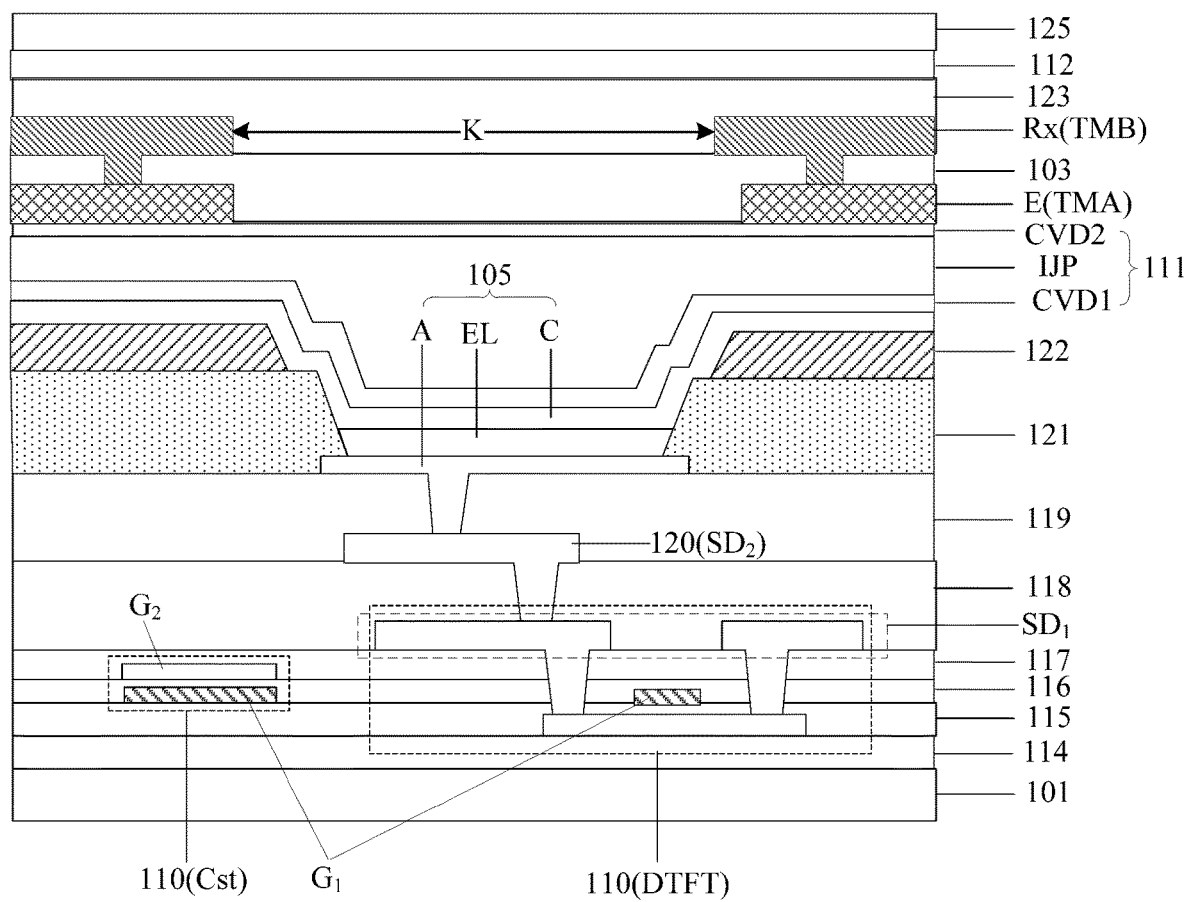
FIG. 9 is a schematic diagram of a cross-sectional structure along the line III-IV in FIG. 1.
Figure 10:
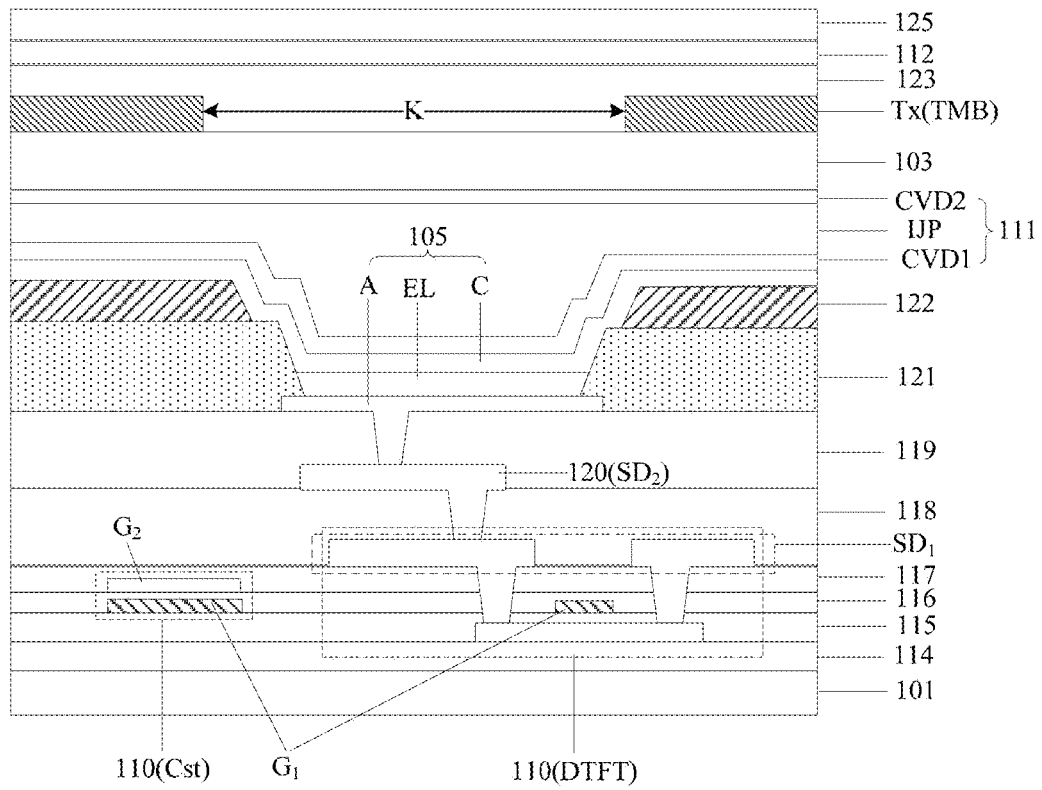
FIG. 10 is a schematic diagram of a cross-sectional structure along the line V-VI in FIG. 1.

As shown in FIG. 9 and FIG. 10, in the present disclosure, a light emitting device 105 is arranged in the display area AA, and generally, a cathode C of the light emitting device 105 is loaded with a low-level (VSS) signal. In a case that an entire surface of the cathode C is arranged (that is, covering the display area AA and at least part of the frame area BB), the cathode C can well shield the interference of external static signals and the like on signals inside the display substrate. But in a case that the cathode C is only arranged in the display area AA and does not cover the frame area BB, the touch signals on the first touch signal lines 1022 located in the first fan-out area $F_1$, the second frame area $B_2$, the third frame area $B_3$ and the fourth frame area $B_4$ are susceptible to interference from static signals. Based on this, in the present disclosure, the second shielding structure 1042 overlapping with the first touch signal lines 1022 is arranged, and the external static signals can be shielded through the second shielding structure 1042, protecting the touch signals from being interfered by the static signals.

In some embodiments, in the above-mentioned display substrate according to embodiments of the present disclosure, as shown in FIG. 5 and FIG. 9 to FIG. 11, the display substrate according to embodiments of the present disclosure includes a first gate metal layer $G_1$, a second gate metal layer $G_2$, a first source-drain metal layer $SD_1$, a second source-drain metal layer $SD_2$, a bridging layer TMA and a touch layer TMB which are stacked on the base substrate 101 and insulated from each other. The first shielding structure 1041 can be located in the touch layer TMB, and the plurality of touch leads 1021 can be located in the bridging layer TMA. Alternatively, the first shielding structure 1041 can be located in at least one of the first source-drain metal layer $SD_1$, the second source-drain metal layer $SD_2$, the bridging layer TMA or the touch layer TMB; and the plurality of touch leads 1021 are located in the first gate metal layer $G_1$ and/or the second gate metal layer $G_2$. In addition, the second shielding structure 1042 can be located in the touch layer TMB, and the plurality of first touch signal lines 1022 can be located in the bridging layer TMA.

The first shielding structure 1041, the second shielding structure 1042, the touch leads 1021 and the touch signal lines 1022 are arranged in existing film layers in the related art, which avoids adding a new film layer, reduces the number of times of masking operations, improves the efficiency of mass production, reduces the production cost, and helps to improve product competitiveness.

It should be noted that, in some embodiments, the second source-drain metal layer $SD_2$ may also not exist. In this case, the display substrate may include the first gate metal layer $G_1$, the second gate metal layer $G_2$, the first source-drain metal layer $SD_1$, the bridging layer TMA and the touch layer TMB which are stacked on the base substrate 101 and insulated from each other.

In addition, in the related art, in the first fan-out area $F_1$, the first gate metal layer $G_1$ and/or the second gate metal layer $G_2$ are provided with fan-out lines of gate lines, and the first source-drain metal layer $SD_1$ is provided with fan-out lines of data lines. Therefore, in order to avoid shorting the touch leads 1021 with the fan-out lines of the data lines in the first gate metal layer $G_1$ and/or the second gate metal layer $G_2$ and avoid shorting the first shielding structure 1041 with the fan-out lines of the data lines in the first source-drain metal layer $SD_1$, the touch leads 1021 in the first gate metal layer $G_1$ and/or the second gate metal layer $G_2$, and the first shielding structure 1041 in the first source-drain metal layer $SD_1$ are arranged in the second fan-out area $F_2$, as shown in FIG. 1.

Figure 12:
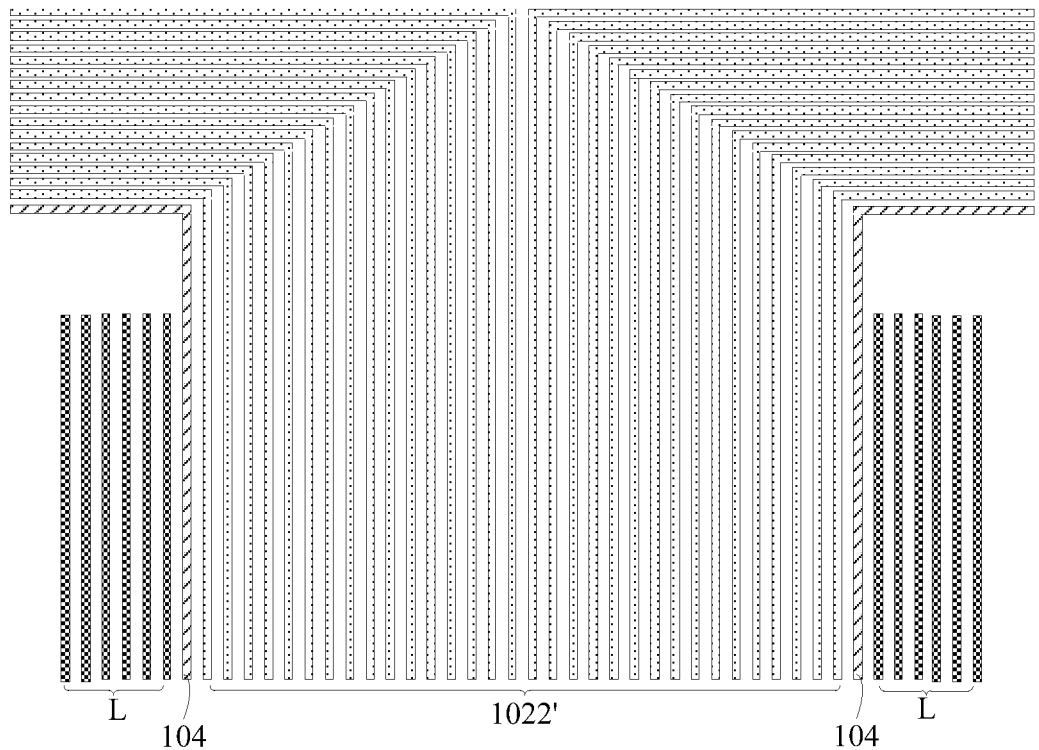
FIG. 12 is a schematic structural diagram of a layer where second touch signal lines are located in the $Z_1$ area in FIG. 1.
Figure 13:
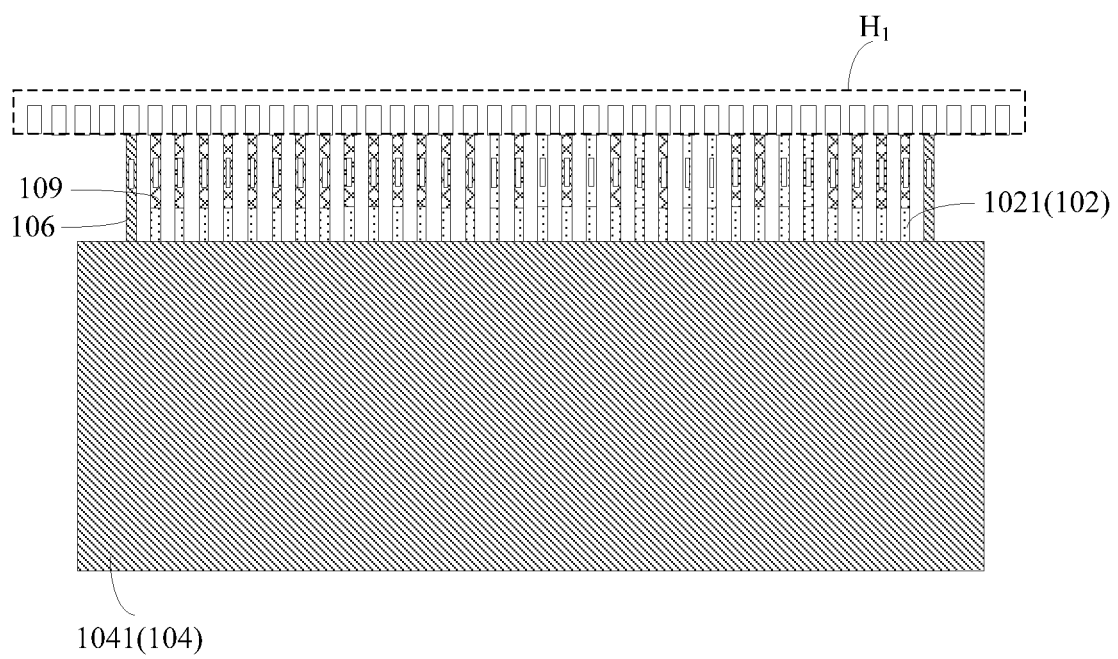
FIG. 13 is another schematic structural diagram of the $Z_1$ area in FIG. 1.
Figure 14:
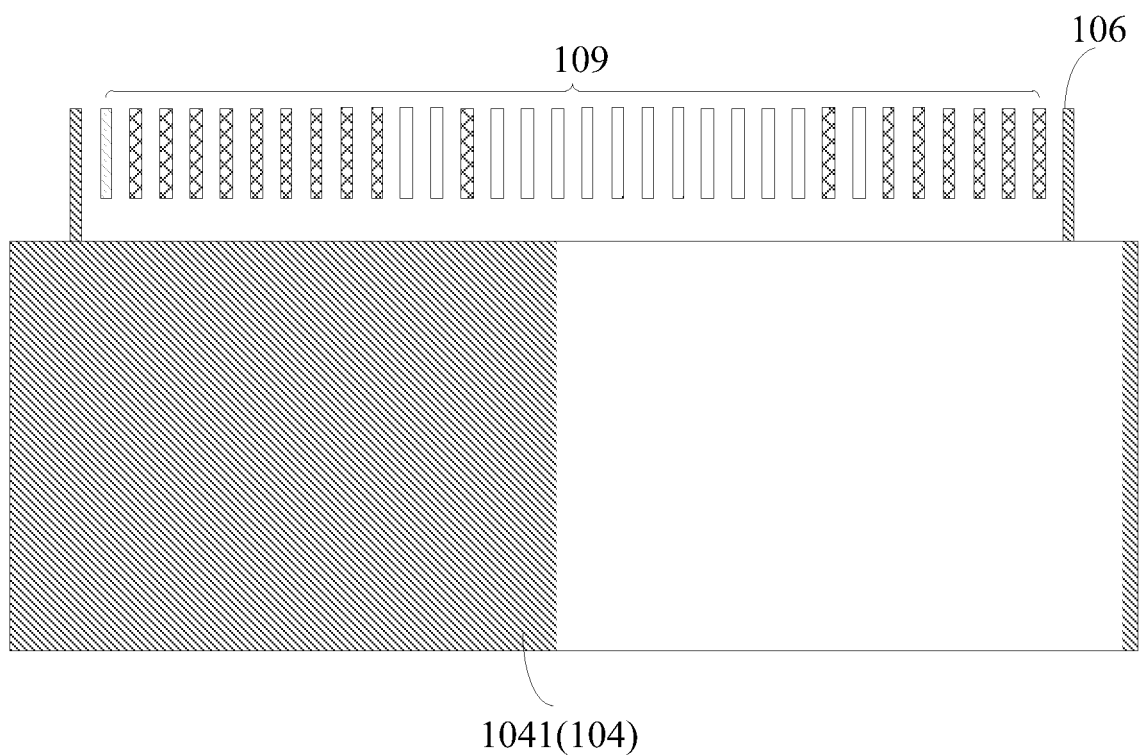
FIG. 14 is another schematic structural diagram of a layer where a first shielding structure is located in the $Z_1$ area in FIG. 1.
Figure 15:
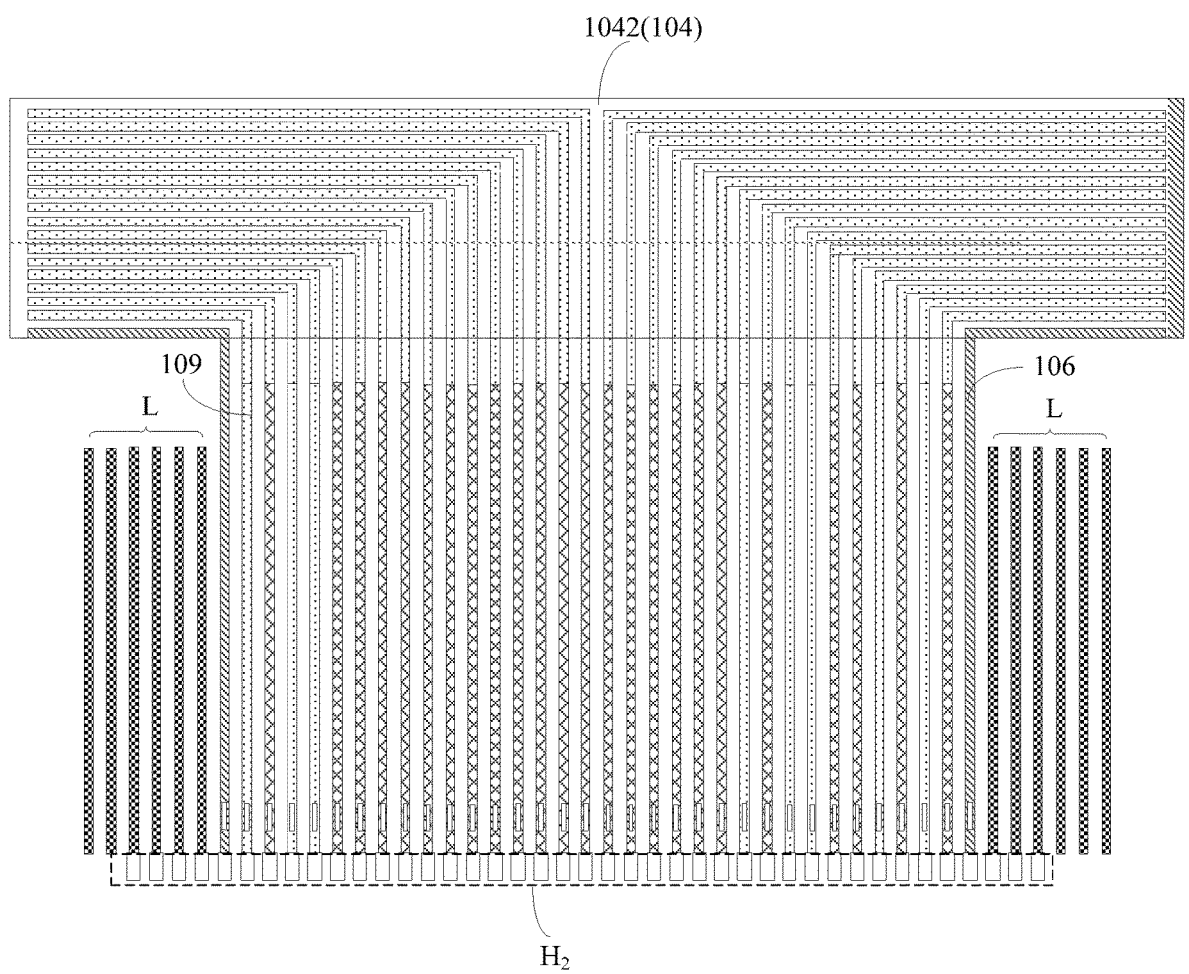
FIG. 15 is another schematic structural diagram of the $Z_2$ area in FIG. 1.
Figure 16:
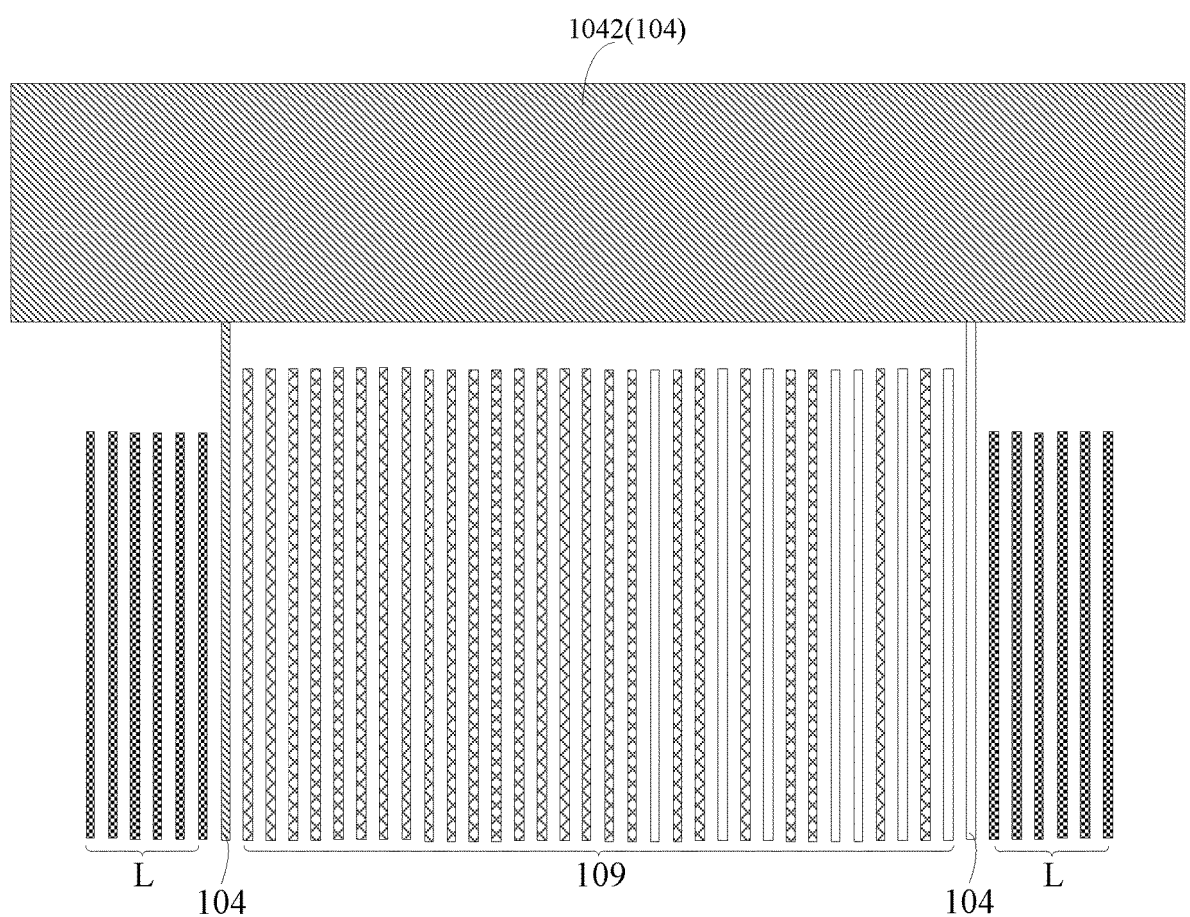
FIG. 16 is another schematic structural diagram of a layer where a second shielding structure is located in the $Z_2$ area in FIG. 1.
Figure 17:
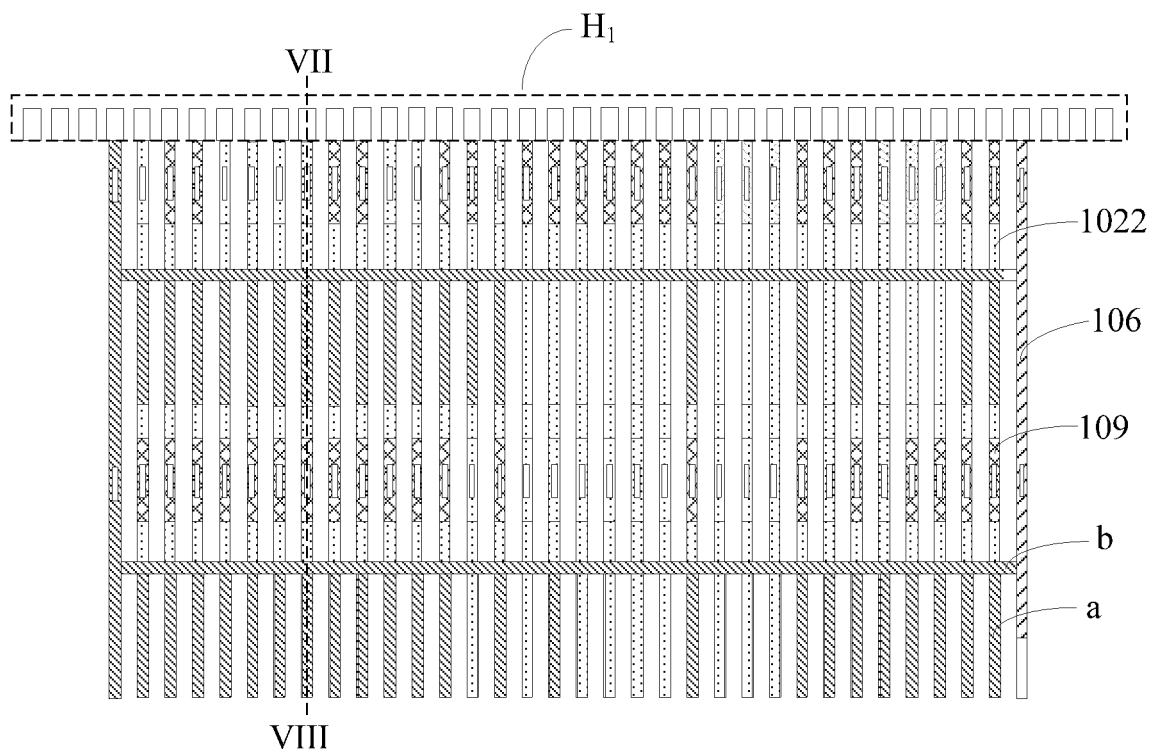
FIG. 17 is another schematic structural diagram of the $Z_1$ area in FIG. 1.
Figure 18:
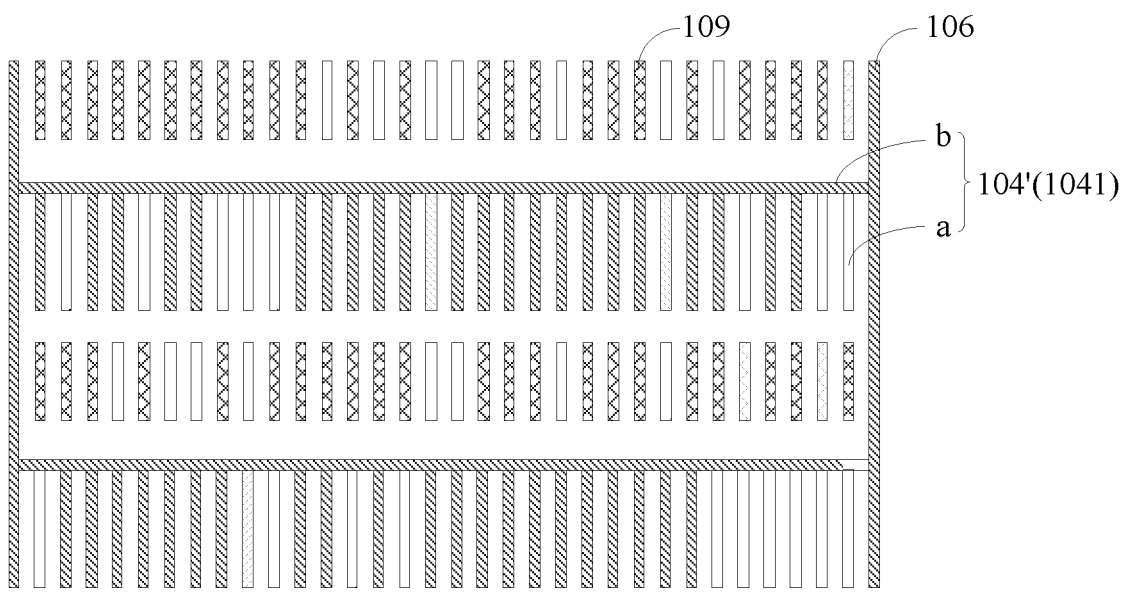
FIG. 18 is another schematic structural diagram of a layer where a first shielding structure is located in the $Z_1$ area in FIG. 1.
Figure 19:
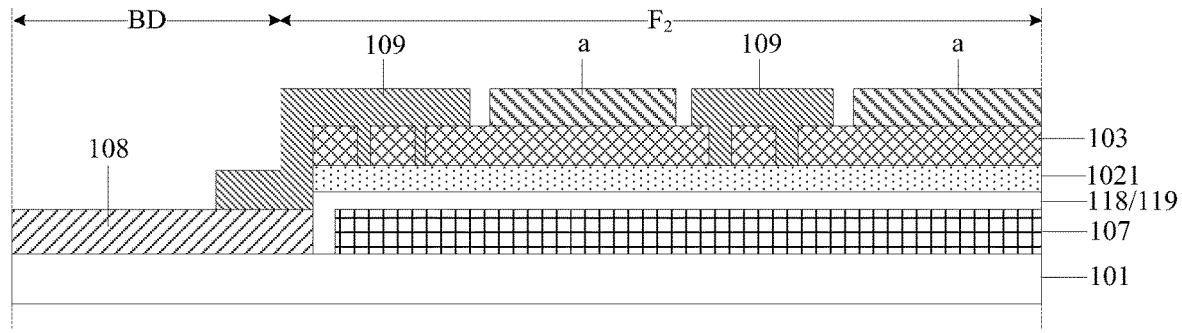
FIG. 19 is a schematic diagram of a cross-sectional structure along the line VII-VIII in FIG. 17.
Figure 20:
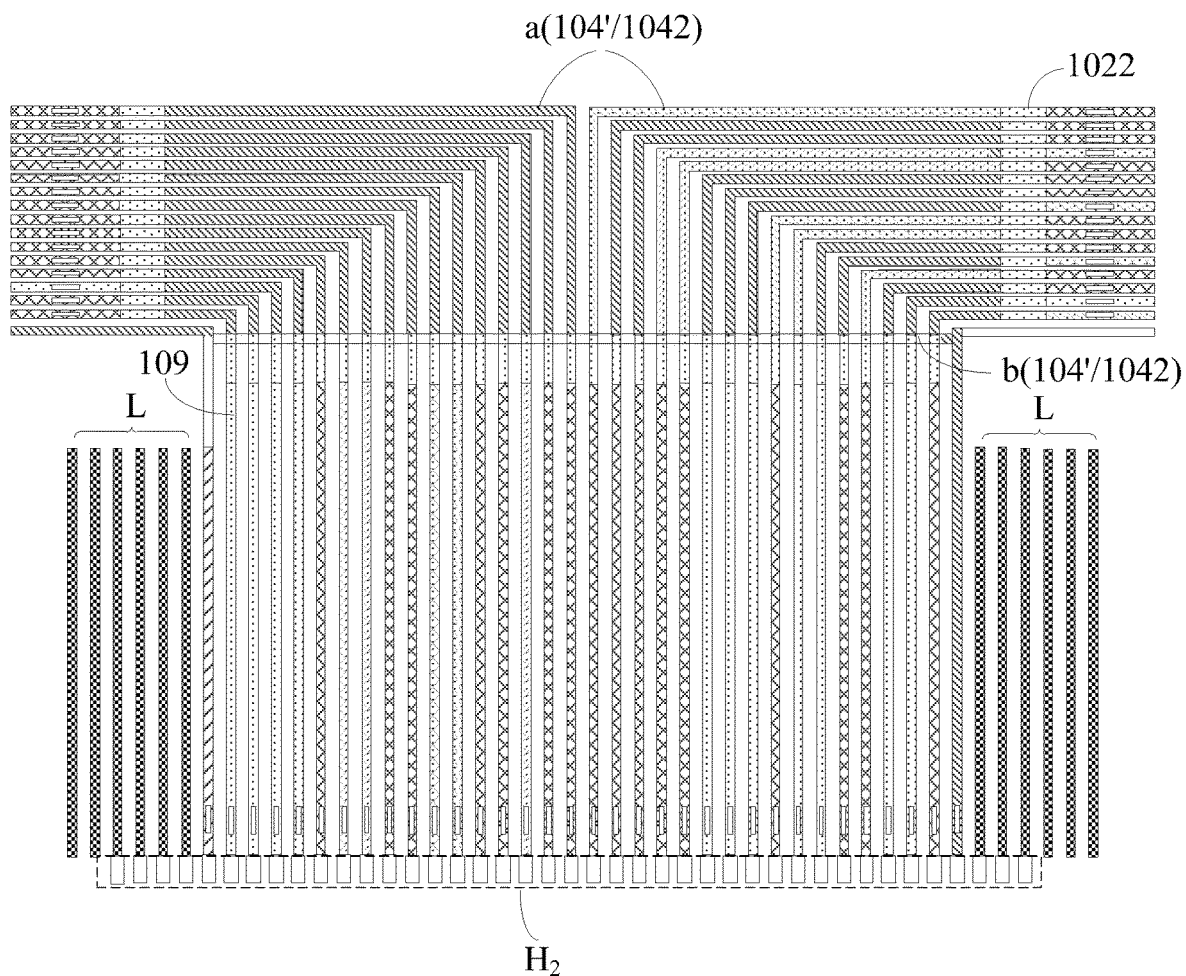
FIG. 20 is another schematic structural diagram of the $Z_2$ area in FIG. 1.
Figure 21:
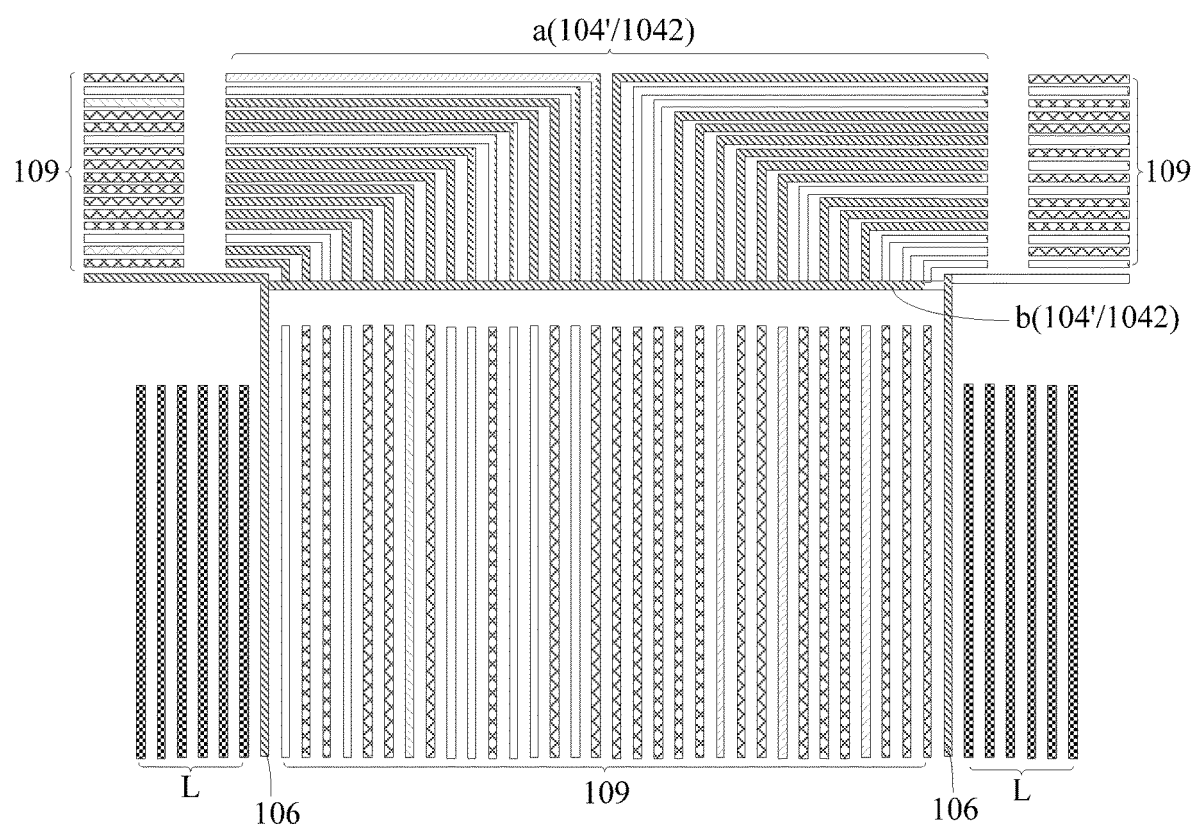
FIG. 21 is another schematic structural diagram of a layer where a second shielding structure is located in the $Z_2$ area in FIG. 1.

In some embodiments, in the above-mentioned display substrate according to embodiments of the present disclosure, in a case that the plurality of first touch signal lines 1022 are located in the bridging layer TMA, and no second shielding structure 1042 is arranged above the plurality of first touch signal lines 1022, in order to reduce the resistances of the first touch signal lines 1022, a plurality of second touch signal lines 1022' located in the first fan-out area $F_1$, the second frame area $B_2$, the third frame area $B_3$ and the fourth frame area $B_4$ can be arranged in the touch layer TMB. At least some of the second touch signal lines 1022' are electrically connected to the first touch signal lines 1022 in one-to-one correspondence, and the wiring method of the second touch signal lines 1022' is the same as the wiring method of the first touch signal lines 1022 electrically connected thereto, as shown in FIG. 7 and FIG. 12.

In some embodiments, as shown in FIG. 1, the touch layer TMB may further include touch driving electrodes Tx and touch sensing electrodes Rx which intersect in extending directions and have a grid shape; and one of the touch driving electrode Tx and the touch sensing electrode Rx is continuously arranged, and the other is disconnected at the intersecting position. FIG. 1 shows that the touch driving electrodes Tx are continuously arranged at the intersecting positions, and the touch sensing electrodes Rx are disconnected at the intersecting positions. The disconnected touch sensing electrodes Rx are electrically connected through bridging electrodes E in the bridging layer TMA. Correspondingly, the first touch signal line 1022 and the second touch signal line 1022' may include a touch driving signal line t electrically connected to the touch driving electrode Tx, and a touch sensing signal line r electrically connected to the touch sensing electrode Rx. In addition, as shown in FIG. 9 and FIG. 10, in order not to affect the light-emitting efficiency of the light emitting device 105, the mesh K of the touch driving electrode Tx and the touch sensing electrode Rx may be greater than or equal to a light emitting area of the light emitting device 105 (that is, a pixel opening area defined by a pixel defining layer 121).

Figure 6:
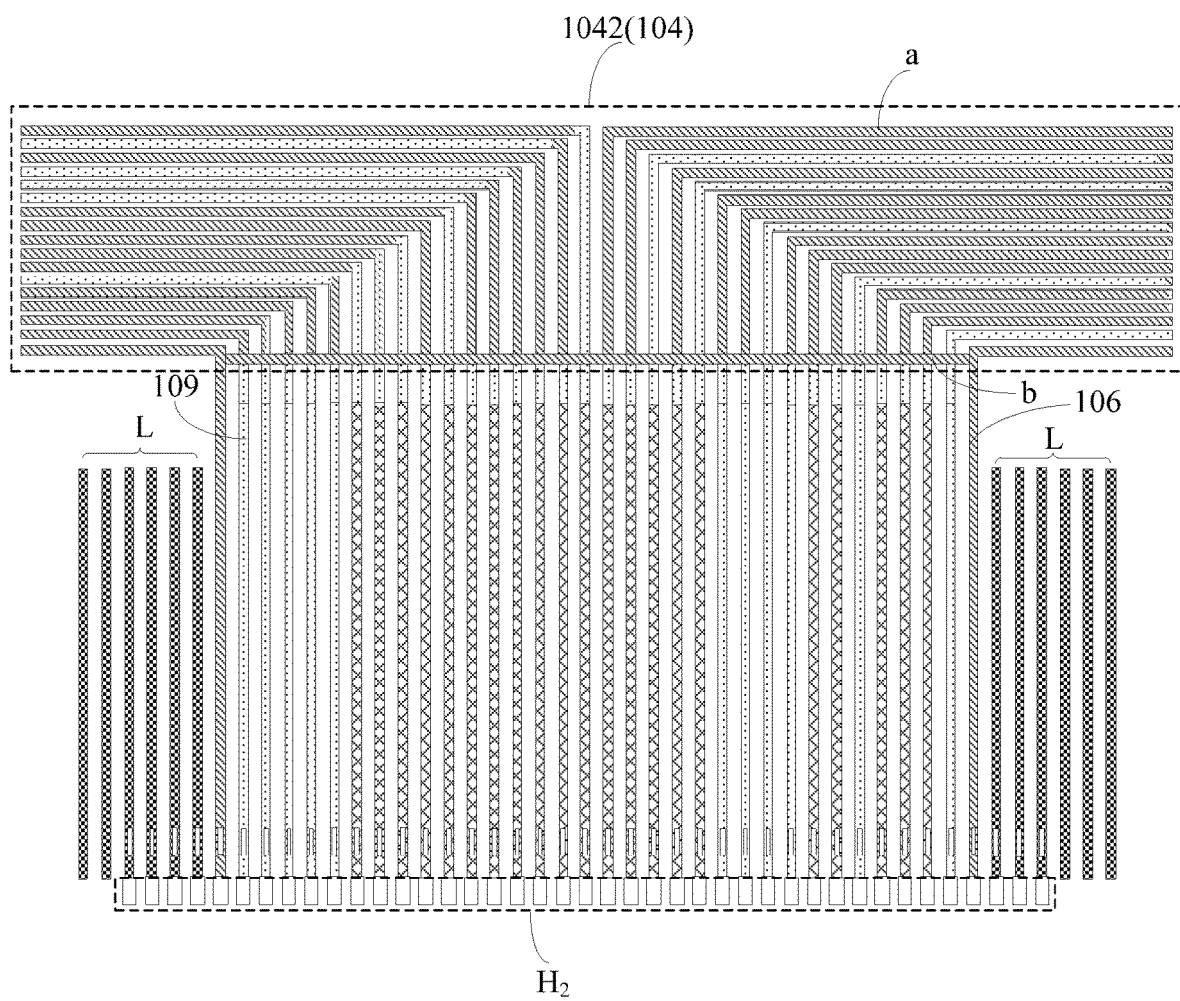
FIG. 6 is a schematic structural diagram of the $Z_2$ area in FIG. 1.
Figure 7:
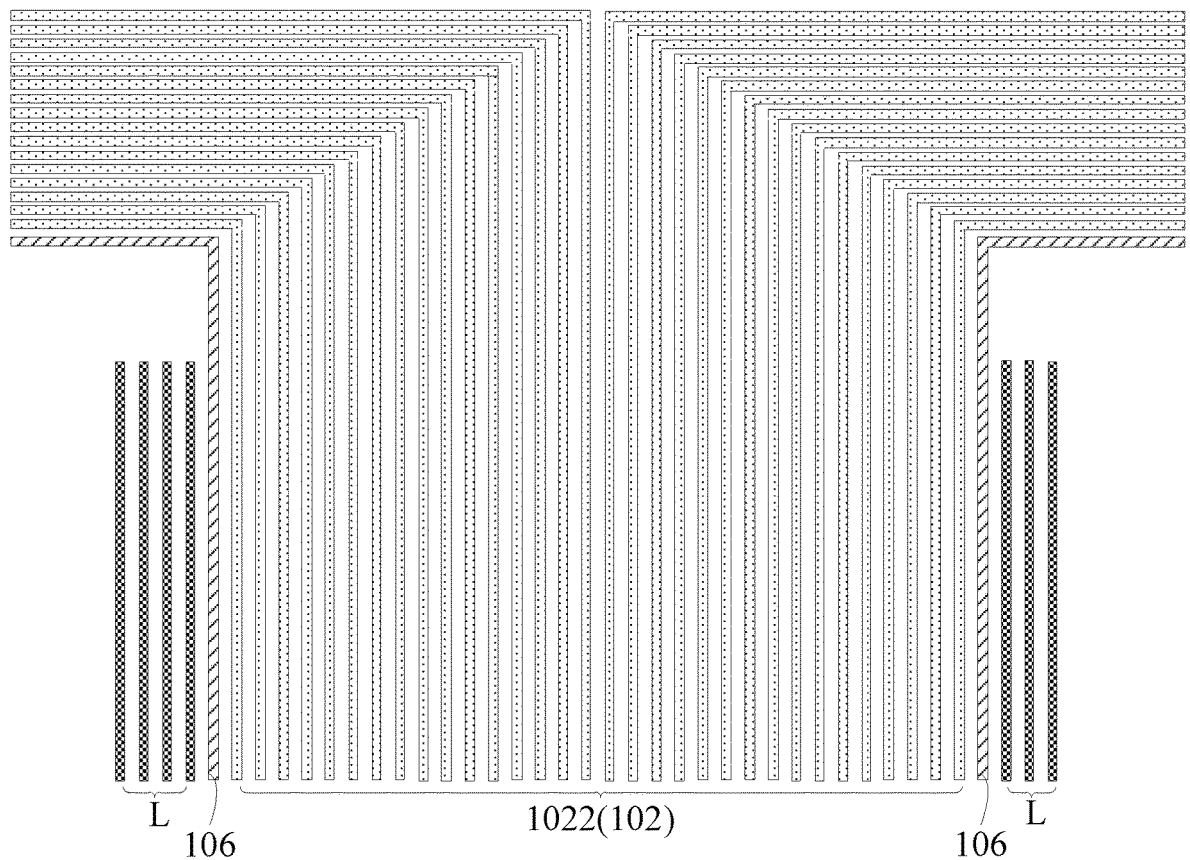
FIG. 7 is a schematic structural diagram of a layer where first touch signal lines are located in the $Z_2$ area in FIG. 1.
Figure 8:
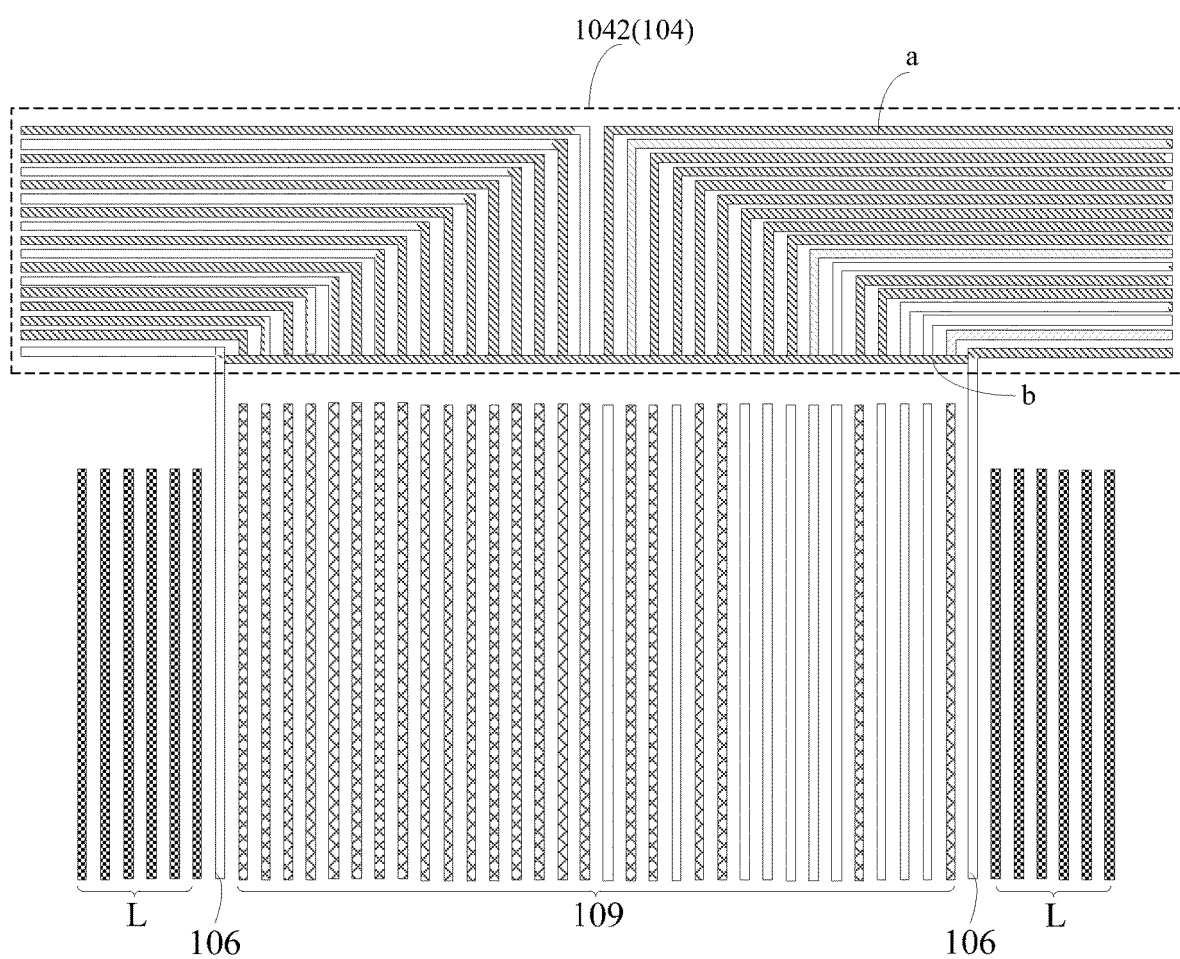
FIG. 8 is a schematic structural diagram of a layer where a second shielding structure is located in the $Z_2$ area in FIG. 1.

In some embodiments, as shown in FIG. 6 to FIG. 8, in the first fan-out area $F_1$, both sides of the touch driving signal lines t and both sides of the touch sensing signal lines r can be provided with dummy lines L, to prevent the insulation layer 103 from being wrinkled or even falling off abnormally, which may result in poor touch. The dummy lines L can be arranged in at least one of the bridging layer TMA or the touch layer TMB. In order to enhance the reinforcement effect on the insulation layer 103, the wiring number of the dummy lines L in the bridging layer TMA can be smaller than the wiring number of the dummy lines L in the touch layer TMB, so that part of the dummy lines L close to the touch driving signal lines t or the touch sensing signal lines r has a double-layer wiring structure in the bridging layer TMA and the touch layer TMB, and other dummy lines L away from the touch driving signal lines t or the touch sensing signal lines r have a single-layer wiring structure in the touch layer TMB.

In some embodiments, in the above display substrate according to embodiments of the present disclosure, as shown in FIG. 1 to FIG. 8, the bridging layer TMA may further include at least one ground wire 106 located on a side, away from the display area AA, of the first touch lines 102; and the shielding structure 104 located in the touch layer TMB and/or the bridging layer TMA can be electrically connected to the ground wire 106, that is, the shielding structure 104 is loaded with a ground signal (GND) through the ground wire 106 to achieve the better signal shielding effect.

Figure 5:
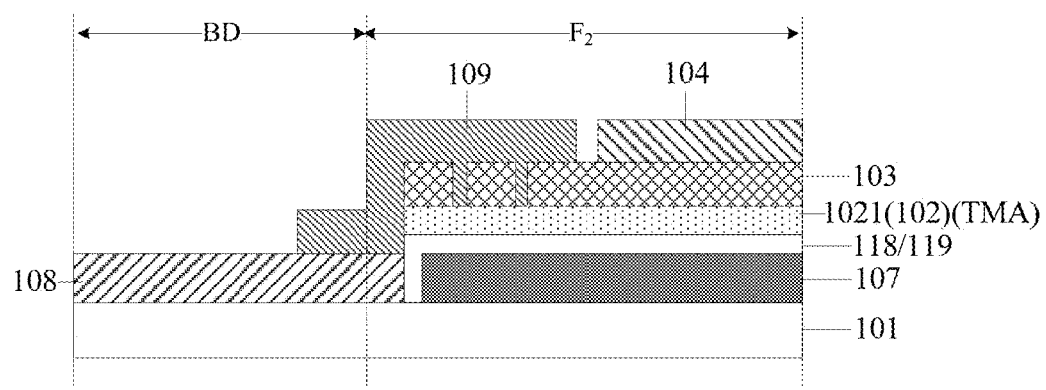
FIG. 5 is a schematic diagram of a cross-sectional structure along the line I-II in FIG. 2.
Figure 11:
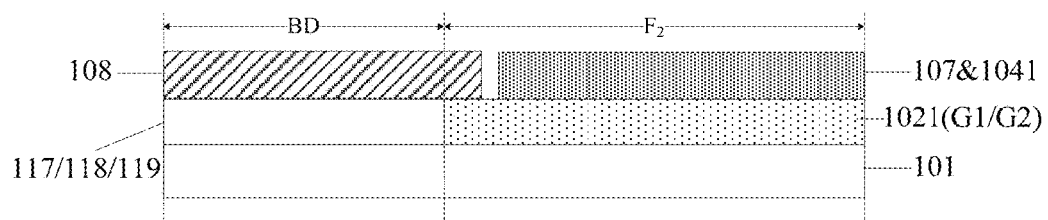
FIG. 11 is another schematic diagram of a cross-sectional structure along the line I-II in FIG. 2.

In some embodiments, in the above display substrate according to embodiments of the present disclosure, as shown in FIG. 5 and FIG. 11, the first source-drain metal layer $SD_1$ and/or the second source-drain metal layer $SD_2$ may further include a low-level signal line 107 which is at least partially around the display area AA and in the frame area BB; and the first shielding structure 1041 located in the first source-drain metal layer $SD_1$ and/or the second source-drain metal layer $SD_2$ can be multiplexed with the low-level signal line 107, to achieve a better signal shielding effect. In implementation, the low-level signal line 107 may be electrically connected to the cathode C of the light emitting device 105 to load the cathode C with a low-level signal.

Figure 2:
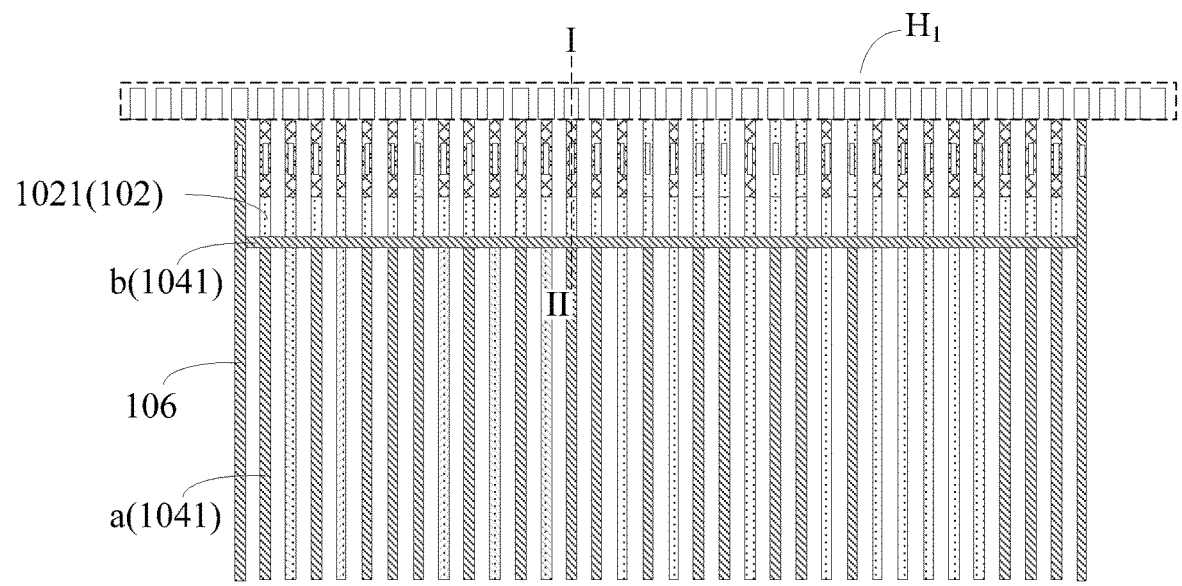
FIG. 2 is a schematic structural diagram of the $Z_1$ area in FIG. 1.
Figure 3:
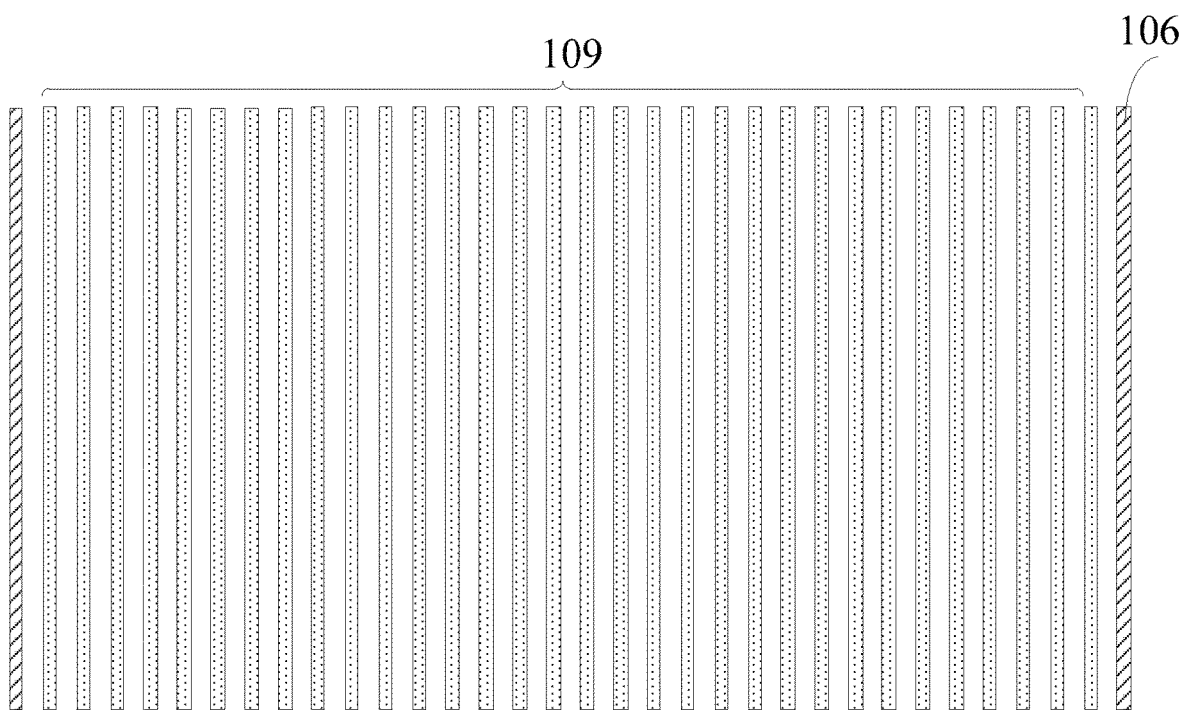
FIG. 3 is a schematic structural diagram of a layer where touch leads are located in the $Z_1$ area in FIG. 1.
Figure 4:
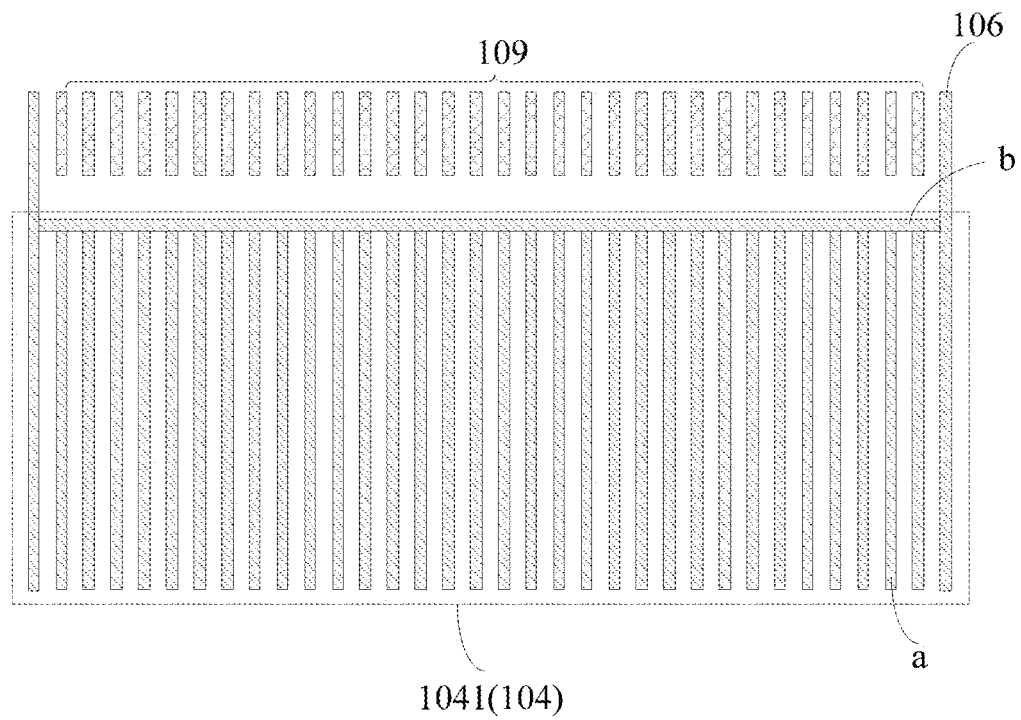
FIG. 4 is a schematic structural diagram of a layer where a first shielding structure is located in the $Z_1$ area in FIG. 1.

In some embodiments, in the above display substrate according to embodiments of the present disclosure, as shown in FIG. 1, the first source-drain metal layer $SD_1$ and/or the second source-drain metal layer $SD_2$ may further include a plurality of connection lines 108 in the bending area BD, and the connection lines 108 are used for connecting the touch leads 1021 and the first touch signal lines 1022. Since the bending stress of the bending area BD is relatively large, the touch leads 1021 and the first touch signal lines 1022 are electrically connected through the connection lines 108 in the first source-drain metal layer $SD_1$ and/or the second source-drain metal layer $SD_2$ by the layer switching, which can effectively reduce the influence of the bending stress on the touch leads 1021 and the first touch signal lines 1022. FIG. 2 shows a first through hole $H_1$ for the electrical connection between the touch lead 1021 and the connection line 108, and FIG. 6 shows a second through hole $H_2$ for the electrical connection between the first touch signal line 1022 and the connection line 108.

In some embodiments, in the above-mentioned display substrate according to embodiments of the present disclosure, as shown in FIG. 3, FIGS. 13-14, FIG. 7, and FIGS. 15-16, an orthographic projection of the shielding structure 104 on the base substrate 101 covers and is larger than orthographic projections of the plurality of first touch lines 102 on the base substrate 101 and orthographic projections of gaps between the first touch lines 102 on the base substrate 101, that is, the shielding structure 104 can be arranged in a block shape. This arrangement can not only effectively shield the mutual interference between the touch signal and the antenna signal directly above the first touch lines 102, but also have a better shielding effect on sides of the first touch lines 102.

In some embodiments, in the above display substrate according to embodiments of the present disclosure, in order to achieve a better shielding effect, as shown in FIG. 2 to FIG. 4 and FIG. 6 to FIG. 8, the shielding structure 104 may include a plurality of first shielding wires a, and second shielding wires b which are on the same layer as the plurality of first shielding wires a and intersect with the plurality of first shielding wires a; where orthographic projections of the plurality of first shielding wires a on the base substrate 101 substantially coincide with orthographic projections of the plurality of first touch lines 102 on the base substrate 101. The "substantially coinciding" means that the first shielding wires a just cover the first touch lines 102, or the first shielding wires a cover most of the corresponding first touch lines 102 (for example, cover 90% to 99%).

In some embodiments, in the above-mentioned display substrate according to embodiments of the present disclosure, in order to take into account the resistance of the first touch line 102 and the shielding effect of the shielding structure 104, as shown in FIG. 3, FIGS. 17-19, FIG. 7, and FIGS. 20-21, the display substrate may further include a plurality of second touch lines 109 located in the frame area BB, the plurality of second touch lines 109 and the shielding structure 104 are on the same layer and have the same material, and at least two second touch lines 109 are electrically connected to one same first touch line 102; the shielding structure 104 includes a plurality of sub-shielding structures 104', and the sub-shielding structure 104' includes a plurality of first shielding wires a, and second shielding wires b which are on the same layer as the plurality of first shielding wires a and intersect with the plurality of first shielding wires a; and in an extending direction of the first touch lines 102, the second touch lines 109 and the first shielding wires a are arranged alternately. A line width of the second touch line 109 and a line width of the first shielding wire a are substantially the same as a line width of the first touch line 102, that is, the line width of the second touch line 109 and the line width of the first shielding wire a may be exactly the same as the line width of the first touch line 102, or may have a certain deviation with the line width of the first touch line 102, for example, the difference may be within the range of 5% of the line width of the first touch line 102.

Figure 22:
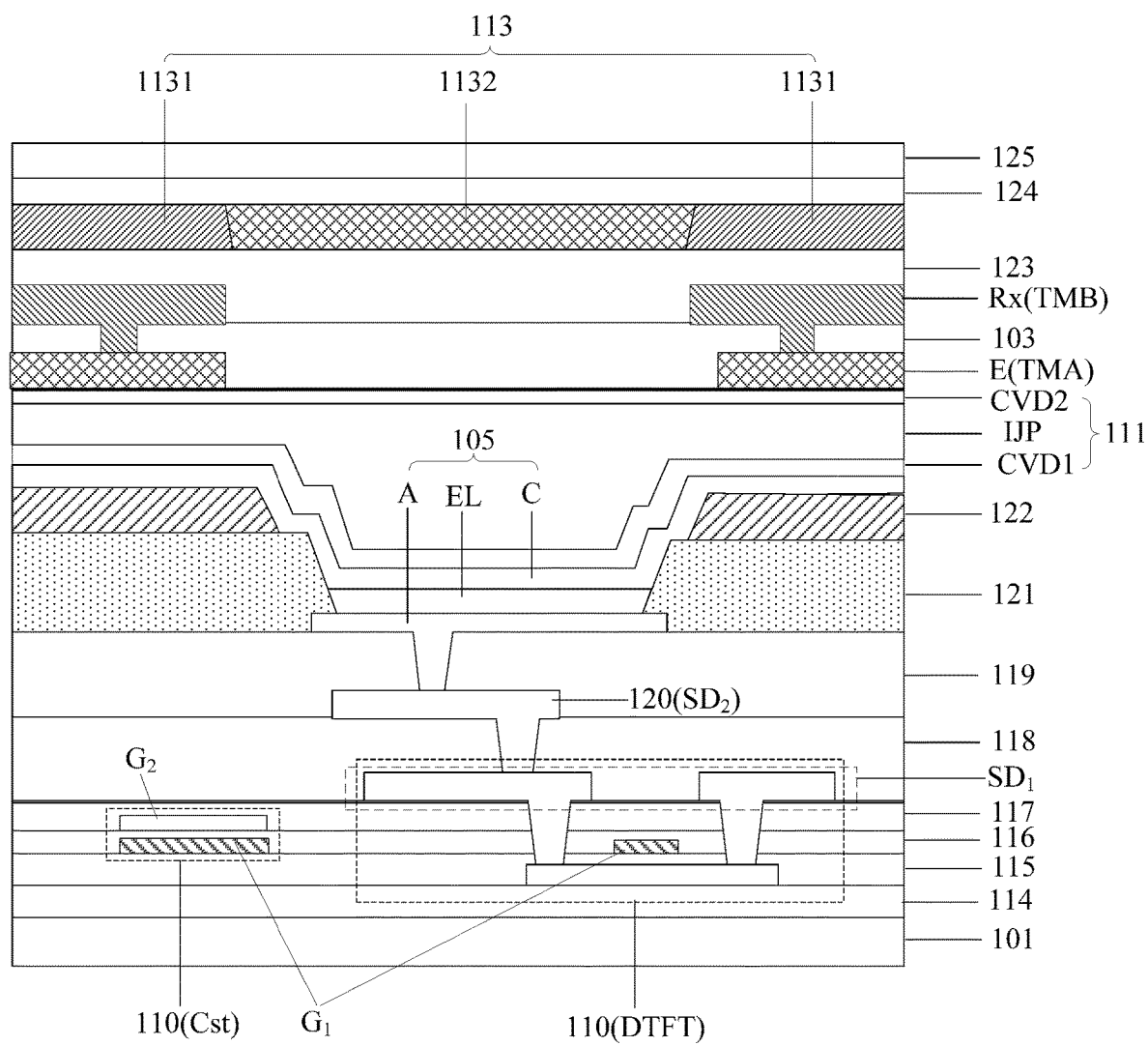
FIG. 22 is another schematic diagram of a cross-sectional structure along the line III-IV in FIG. 1.
Figure 23:
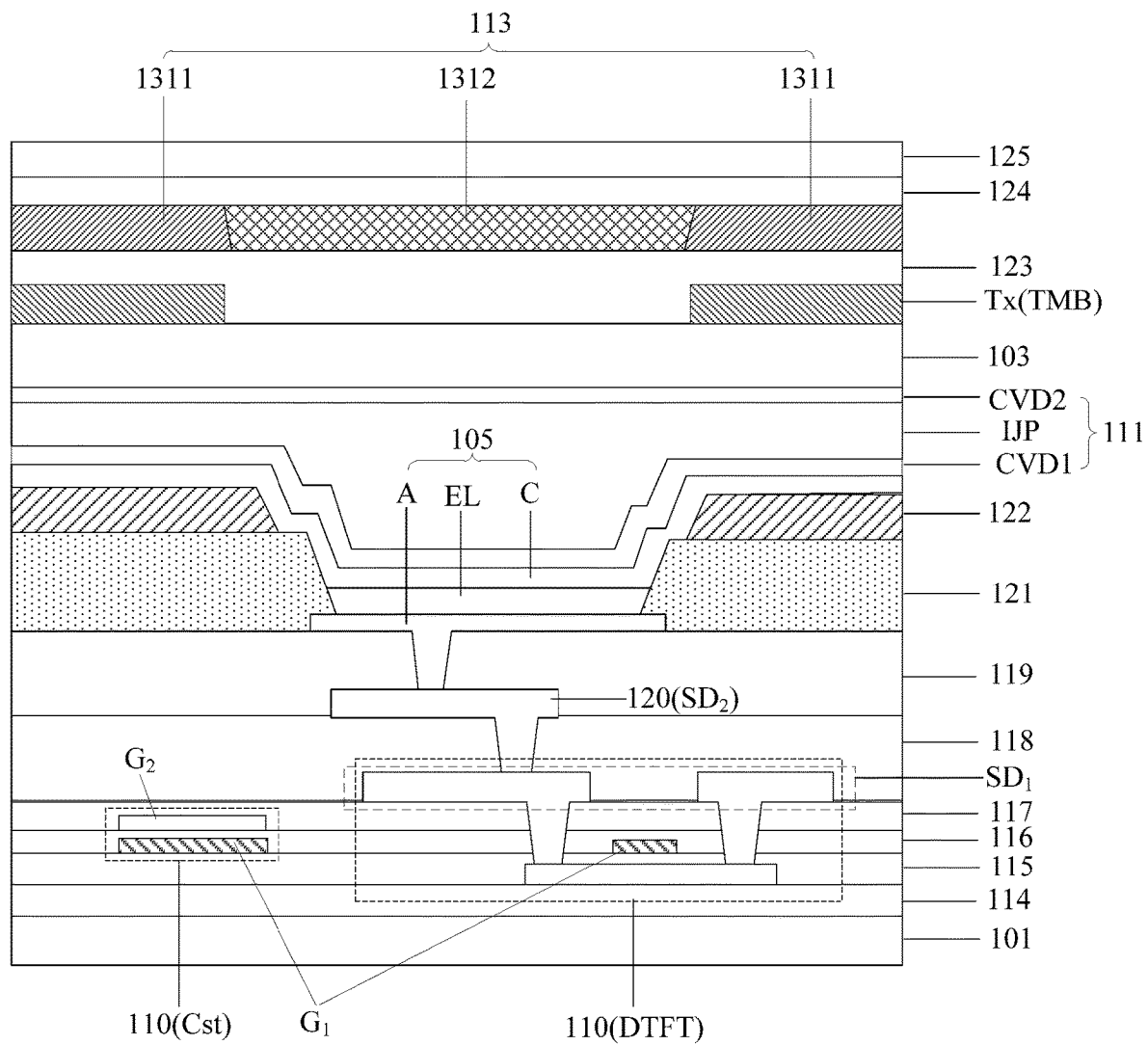
FIG. 23 is another schematic diagram of a cross-sectional structure along the line V-VI in FIG. 1.

In some embodiments, the above-mentioned display substrate according to embodiments of the present disclosure, as shown in FIG. 9 and FIG. 10, the display substrate may further include: a pixel driving circuit 110 (FIG. 9 and FIG. 10 only show the driving transistor DTFT and the storage capacitor Cst), an encapsulation layer 111 and a circular polarizer 112. The pixel driving circuit 110 is electrically connected to an anode A of the light emitting device 105 to drive the light emitting device 105 to emit light for display. The encapsulation layer 111 includes a first inorganic encapsulation layer CVD1, an organic encapsulation layer IJP and a second inorganic encapsulation layer CVD2 which are stacked, to effectively prevent water and oxygen from corroding a light emitting material layer EL in the light emitting device 105, and improve the life of the light emitting device 105. The circular polarizer 112 includes a linear polarization layer and a quarter-wave plate layer, which can reduce the reflection of ambient light by the anode A/cathode C of the light emitting device 105 and metal layers (such as $G_1$, $G_2$, $SD_1$ and $SD_2$, etc.) of the pixel driving circuit 110. In some embodiments, as shown in FIG. 22 and FIG. 23, a color filter layer 113 may also be used to reduce the reflection of ambient light by the anode A/cathode C of the light emitting device 105 and metal layers of the pixel driving circuit 110. Compared with the circular polarizer 112, the color filter layer 113 has greater transmittance of emitted light of the light emitting device 105. Optionally, the color filter layer 113 includes black matrices 1131 and a plurality of color resistances 1132 separated by the black matrices 1131. The color resistances 1132 may include red color resistances R, green color resistances G, and blue color resistances B. The black matrices 1131 completely cover grid lines of the touch driving electrodes Tx and the touch sensing electrodes Rx.

In addition, as shown in FIG. 9, FIG. 10, FIG. 22 and FIG. 23, the above-mentioned display substrate according to embodiments of the present disclosure may further include a buffer layer 114, a first gate insulating layer 115, a second gate insulating layer 116, an interlayer dielectric layer 117, an inorganic layer 118, a first planarization layer 119, a switching electrode 120, a pixel defining layer 121, a support layer 122, a second planarization layer 123, a third planarization layer 124, and a protective cover plate 125 (for example, ultra-thin glass cover plate), etc. Other essential components of the display substrate should be understood by those of ordinary skill in the art, and are not repeated here, nor should they be used as limitations on the present disclosure.

Figure 24:
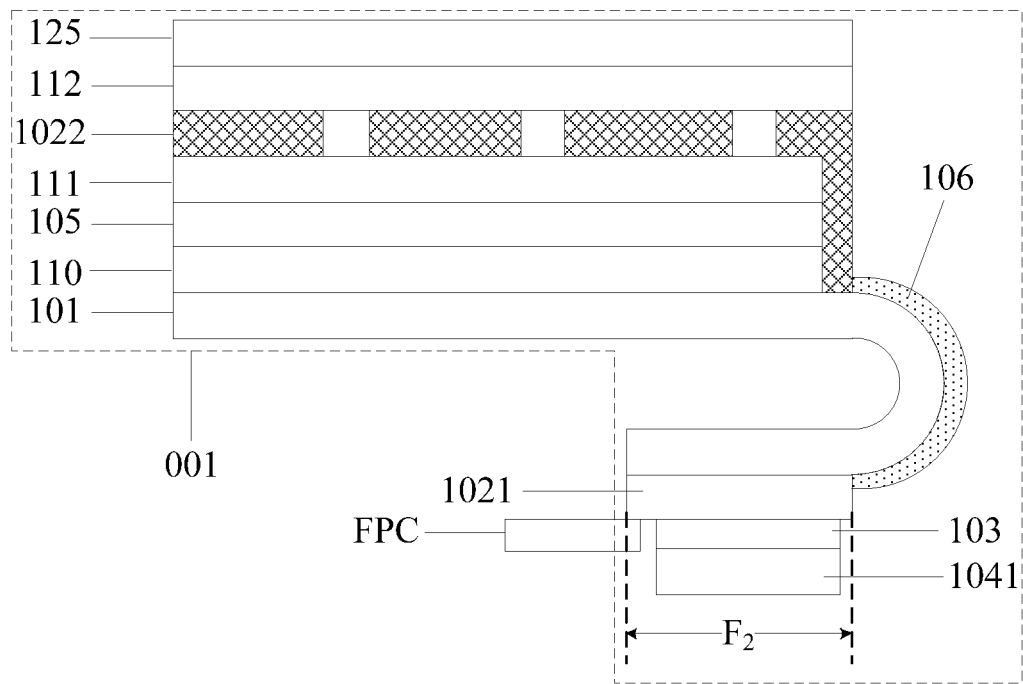
FIG. 24 is a schematic structural diagram of a display device according to an embodiment of the present disclosure.

Based on the same inventive concept, the present disclosure further provides a display device, as shown in FIG. 24, including the above-mentioned display substrate 001 according to embodiments of the present disclosure. The display substrate 001 may be a display substrate such as the OLED or the quantum dot light emitting diodes (QLED). Since the principle of solving the problem by the display device is similar to the principle of solving the problem by the above-mentioned display substrate, the implementation of the display device can refer to the above-mentioned embodiments of the display substrate, and descriptions will not be repeated. In some embodiments, the above-mentioned display substrate according to embodiments of the present disclosure, as shown in FIG. 24, may further include a flexible circuit board FPC electrically connected to the display substrate 001, and the flexible circuit board FPC is located on an opposite side of a display side (that is, the side where the protective cover plate 125 is located) of the display device.

In some embodiments, as shown in FIG. 1 and FIG. 24, the display substrate 001 includes a display area AA, and a first frame area $B_1$ on a side of the display area AA for binding to the flexible circuit board FPC. The first frame area $B_1$ includes a first fan-out area $F_1$, a bending area BD and a second fan-out area $F_2$ arranged in sequence in a direction away from the display area AA. The first fan-out area $F_1$ is located on the display side (that is, the side where the protective cover plate 125 is located), and the second fan-out area $F_2$ is located on the opposite side of the display side (that is, the side where the protective cover plate 125 is located), to facilitate the binding connection of the touch leads 1021 in the second fan-out area $F_2$ with the flexible circuit board FPC. Moreover, the second fan-out area $F_2$ is bent to the opposite side of the display side (that is, the side where the protective cover plate 125 is located), which can effectively reduce the width of the first frame area $B_1$ where the second fan-out area $F_2$ is located.

In some embodiments, the above-mentioned display device according to embodiments of the present disclosure may be: a mobile phone, a tablet computer, a television, a monitor, a laptop computer, a digital photo frame, a navigator, a smart watch, a fitness wristband, a personal digital assistant, or any other product or component having the display function. The display device according to embodiments of the present disclosure may also include but not limited to: a radio frequency unit, a network module, an audio output unit, an input unit, a sensor, a display unit, a user input unit, an interface unit, a memory, a processor, and a power supply, etc. Those skilled in the art can understand that the composition of the above display device does not constitute a limitation on the display device, and the display device may include more or less of the above components, or a combination of some components, or a different arrangement of components.

Although embodiments of the present disclosure have been described, those skilled in the art can make various modifications and variations to embodiments of the present disclosure without departing from the spirit and scope of embodiments of the present disclosure. In this way, if these modifications and variations of embodiments of the present disclosure fall within the scope of the claims of the present disclosure and their equivalent technologies, the present disclosure also intends to include these modifications and variations.

What is claimed is:

1. A display substrate, comprising:
a base substrate; wherein the base substrate comprises a display area, and a frame area surrounding the display area;
a plurality of first touch lines in the frame area located on at least one side of the display area;
an insulation layer on a side, away from the base substrate, of a layer where the plurality of first touch lines are located; and
a shielding structure on a side, away from the layer where the plurality of first touch lines are located, of the insulation layer;
wherein the shielding structure is in the frame area located on at least one side of the display area; and
in a same frame area, an orthographic projection of the shielding structure on the base substrate overlaps with an orthographic projection of at least part of the plurality of first touch lines on the base substrate;
wherein the frame area comprises a first frame area for binding to a flexible circuit board, a second frame area opposite to the first frame area, a third frame area connecting the first frame area and the second frame area, and a fourth frame area opposite to the third frame area;
wherein the first frame area comprises a first fan-out area, a bending area and a second fan-out area arranged in sequence in a direction away from the display area; and
in the first fan-out area, the second frame area, the third frame area and the fourth frame area, the shielding structure comprises a second shielding structure, and the plurality of first touch lines comprise a plurality of first touch signal lines.

2. The display substrate according to claim 1, wherein the frame area comprises a first frame area for binding to a flexible circuit board;
the shielding structure comprises a first shielding structure in the first frame area; and
the plurality of first touch lines comprise a plurality of touch leads in the first frame area.

3. The display substrate according to claim 2, further comprising a bridging layer and a touch layer which are stacked on the base substrate and insulated from each other;
wherein the first shielding structure is located in the touch layer, and the plurality of touch leads are located in the bridging layer.

4. The display substrate according to claim 3, wherein the bridging layer further comprises at least one ground wire on a side, away from the display area, of the first touch lines; and
the shielding structure in the touch layer and/or the bridging layer is electrically connected to the ground wire.

5. The display substrate according to claim 2, further comprising a first gate metal layer, a second gate metal layer, a first source-drain metal layer, a second source-drain metal layer, a bridging layer and a touch layer which are stacked on the base substrate and insulated from each other;
wherein the first shielding structure is located in at least one of the first source-drain metal layer, the second source-drain metal layer, the bridging layer, or the touch layer; and
the plurality of touch leads are located in the first gate metal layer and/or the second gate metal layer.

6. The display substrate according to claim 5, wherein the first frame area comprises a first fan-out area, a bending area and a second fan-out area arranged in sequence in a direction away from the display area; and the first shielding structure and the plurality of touch leads are located in the second fan-out area.

7. The display substrate according to claim 6, wherein the frame area further comprises a second frame area opposite to the first frame area, a third frame area connecting the first frame area and the second frame area, and a fourth frame area opposite to the third frame area; and in the first fan-out area, the second frame area, the third frame area and the fourth frame area, the plurality of first touch lines further comprise a plurality of first touch signal lines in the bridging layer, the touch layer further comprises a plurality of second touch signal lines, and at least part of the plurality of second touch signal lines are electrically connected to the plurality of first touch signal lines in one-to-one correspondence.

8. The display substrate according to claim 7, wherein the first source-drain metal layer and/or the second source-drain metal layer further comprises a plurality of connection lines in the bending area; and the plurality of connection lines connect the touch leads and the first touch signal lines.

9. The display substrate according to claim 5, wherein the first source-drain metal layer and/or the second source-drain metal layer further comprises a low-level voltage signal line at least partially around the display area and in the frame area; and the first shielding structure in the first source-drain metal layer and/or the second source-drain metal layer is multiplexed with reused as the low-level voltage signal line.

10. The display substrate according to claim 1, further comprising a bridging layer and a touch layer which are stacked on the base substrate and insulated from each other;

wherein the second shielding structure is located in the touch layer, and the plurality of first touch signal lines are located in the bridging layer.

11. The display substrate according to claim 10, further comprising: a plurality of dummy lines in the first fan-out area;

wherein, in the first fan-out area, the plurality of first touch signal lines are divided into at least one group of touch signal lines, and the plurality of dummy lines are on at least one side of both edges of the at least one group of touch signal lines.

12. The display substrate according to claim 11, wherein the plurality of dummy lines comprise a plurality of first dummy lines in the touch layer, and a plurality of second dummy lines in the bridging layer;

wherein, the plurality of first dummy lines have a greater number than the plurality of second dummy lines; and an orthographic projection of each of the plurality of second dummy lines on the base substrate substantially coincides with an orthographic projection of one of the plurality of first dummy lines on the base substrate.

13. The display substrate according to claim 1, wherein an orthographic projection of the shielding structure on the base substrate covers and is larger than orthographic projections of the plurality of first touch lines on the base substrate, and orthographic projections of gaps between the first touch lines on the base substrate.

14. The display substrate according to claim 1, wherein the shielding structure comprises a plurality of first shielding wires, and second shielding wires which are on a same layer as and intersect with the plurality of first shielding wires;

wherein orthographic projections of the plurality of first shielding wires on the base substrate substantially coincide with orthographic projections of the plurality of first touch lines on the base substrate.

15. The display substrate according to claim 1, further comprising a plurality of second touch lines in the frame area;

wherein the plurality of second touch lines and the shielding structure are on a same layer and have a same material, and at least two second touch lines are electrically connected to one same first touch line;

wherein the shielding structure comprises a plurality of sub-shielding structures, and the sub-shielding structure comprises a plurality of first shielding wires and second shielding wires on a same layer as the plurality of first shielding wires and intersecting with the plurality of first shielding wires;

wherein, in an extending direction of the first touch lines, the second touch lines and the first shielding wires are arranged alternately.

16. The display substrate according to claim 15, wherein a line width of the second touch line and a line width of the first shielding wire are substantially same as a line width of the first touch line.

17. A display device, comprising the display substrate according to claim 1.

18. The display device according to claim 17, further comprising a flexible circuit board electrically connected to the display substrate;

wherein the flexible circuit board is on an opposite side of a display side of the display device.

19. The display device according to claim 18, wherein the display substrate comprises the display area, and a first frame area on a side of the display area for binding to the flexible circuit board;

wherein, the first frame area comprises a first fan-out area, a bending area and a second fan-out area arranged in sequence in a direction away from the display area;

wherein the first fan-out area is on the display side, and the second fan-out area is on the opposite side.

* * * * *